(12) United States Patent
Jang et al.

(10) Patent No.: US 11,398,838 B2
(45) Date of Patent: Jul. 26, 2022

(54) DEVICE AND METHOD TO TRANSMIT AND RECEIVE SIGNAL IN COMMUNICATION SYSTEM

(71) Applicant: Samsung Electronics Co., Ltd., Suwon-si (KR)

(72) Inventors: Min Jang, Suwon-si (KR); Hyuntack Lim, Suwon-si (KR); Hongsil Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 104 days.

(21) Appl. No.: 16/914,801

(22) Filed: Jun. 29, 2020

(65) Prior Publication Data

US 2021/0013902 A1 Jan. 14, 2021

(30) Foreign Application Priority Data

Jul. 9, 2019 (KR) .................. 10-2019-0082881

(51) Int. Cl.
*H03M 13/00* (2006.01)
*H03M 13/15* (2006.01)
(Continued)

(52) U.S. Cl.
CPC .......... *H03M 13/1575* (2013.01); *H04B 1/06* (2013.01); *H04W 84/042* (2013.01)

(58) Field of Classification Search
CPC .... H03M 13/13; H03M 13/09; H03M 13/353; H04L 1/0041; H04L 1/0057; H04L 1/00; H04L 1/0063; H04L 1/0009; H04L 1/0061
See application file for complete search history.

(56) References Cited

U.S. PATENT DOCUMENTS 9,362,950 B2 * 6/2016 Wiley ................ H04L 1/00
10,171,204 B2 * 1/2019 Wu ................ H03M 13/2792
(Continued)

FOREIGN PATENT DOCUMENTS

WO 2018/087717 A1 5/2018
WO 2018/165894 A1 9/2018
(Continued)

OTHER PUBLICATIONS

International Search Report dated Oct. 6, 2020, issued in International Application No. PCT/KR2020/008446.
(Continued)

*Primary Examiner* — Esaw T Abraham
(74) *Attorney, Agent, or Firm* — Jefferson IP Law, LLP

(57) ABSTRACT

The disclosure relates to a pre-5$^{th}$-generation (5G) or 5G communication system to be provided for supporting higher data rates beyond 4th-generation (4G) communication system, such as a long-term evolution (LTE). A method of a receiving device in a communication system is provided. The method includes receiving a signal, and decoding the received signal based on a polar decoding scheme which is based on a successive cancellation (SC) scheme to estimate an information sequence, wherein, in the polar decoding scheme, a second number of parity bits among a first number of parity bits of an outer code included in an input bit sequence to a polar encoder are used in an error detection operation, and a third number of parity bits among the first number of parity bits are used in an error correction operation.

20 Claims, 19 Drawing Sheets

(51) Int. Cl.
*H04B 1/06* (2006.01)
*H04W 84/04* (2009.01)

(56) References Cited

U.S. PATENT DOCUMENTS

| | | | |
|---|---|---|---|
| 10,313,057 B2* | 6/2019 | Lin | H03M 13/2933 |
| 10,348,451 B2* | 7/2019 | Kudekar | H04L 1/0057 |
| 10,361,717 B2* | 7/2019 | Ge | H03M 13/13 |
| 10,498,490 B2* | 12/2019 | Hui | H03M 13/2906 |
| 10,727,976 B2* | 7/2020 | Wesslen | H04L 1/0071 |
| 10,833,705 B2* | 11/2020 | Jiang | H03M 13/136 |
| 11,197,291 B2* | 12/2021 | Hui | H04L 1/0057 |
| 2017/0187396 A1 | 6/2017 | Jeong et al. | |
| 2017/0366199 A1 | 12/2017 | Ge et al. | |
| 2019/0089481 A1 | 3/2019 | Zhang et al. | |
| 2019/0349141 A1* | 11/2019 | Ahn | H03M 13/6362 |
| 2020/0067528 A1* | 2/2020 | Arikan | H04L 1/0071 |

FOREIGN PATENT DOCUMENTS

| | | |
|---|---|---|
| WO | 2018/175557 A1 | 9/2018 |
| WO | 2018/192514 A1 | 10/2018 |
| WO | 2018/231924 A1 | 12/2018 |

OTHER PUBLICATIONS

Ankan, Channel Polarization: a method for constructing capacity-achieving codes for symmetric binary-input memoryless channels, Jul. 20, 2009.

Tal et al., List decoding of polar codes, May 31, 2012.

5G; NR; Multiplexing and channel coding (3GPP TS 38.212 version 15.2.0 Release 15), Jul. 1, 2018, ETSI TS 138 212 V15.2.0, Sophia Antipolis, France.

Trifonov et al., Polar codes with dynamic frozen symbols and their decoding by directed search, Sep. 2013.

Wang et al., Parity-check-concatenated polar codes, IEEE Communications Letters, vol. 20, No. 12, Dec. 2016.

Zhang et al., Parity-check polar coding for 5G and beyond, Jan. 11, 2018.

Qingping Yu et al., "Hybrid Parity-Check and CRC Aided SCL Decoding for Polar Codes", Proc. 2016 IEEE International Conference On Internet of Things (ITHINGS) and IEEE Green Computing and Communications (GREENCOM) and IEEE Cyber, Physical and Social Computing (CPSCOM) and IEEE Smartdata (SMARTDATA), IEEE, Dec. 15, 2016, pp. 711-716, XP033093024.

Fang Yuan et al., "Double-Parity-Check CA-SCL Encoding and Decoding for Polar Codes", Proc. 2018 14th IEEE International Conference On Signal Processing (ICSP), IEEE, Aug. 12, 2018, pp. 747-751, XP033524268.

Huawei et al., "Polar code design", 3GPP Draft, R1-1706965, 3rd Generation Partnership Project (3GPP), vol. RAN WG1, Hangzhou, China, May 15, 2017-May 19, 2017, May 7, 2017, XP051262876.

Extended European Search Report dated Apr. 25, 2022, issued in European Patent Application No. 20836545.2-1210.

* cited by examiner

DEVICE AND METHOD TO TRANSMIT AND RECEIVE SIGNAL IN COMMUNICATION SYSTEM

CROSS-REFERENCE TO RELATED APPLICATION(S)

This application is based on and claims priority under 35 U.S.C. § 119(a) of a Korean patent application number 10-2019-0082881, filed on Jul. 9, 2019, in the Korean Intellectual Property Office, the disclosure of which is incorporated by reference herein in its entirety.

BACKGROUND

1. Field

The disclosure relates to a device and a method to transmit and receive a signal in a communication system. More particularly, the disclosure relates to a device and a method to transmit and receive a signal based on a polar code in a communication system.

2. Description of Related Art

To meet the demand for wireless data traffic, which has increased since deployment of 4th-generation (4G) communication systems, efforts have been made to develop an improved 5th-generation (5G) or pre-5G communication system. Therefore, the 5G or pre-5G communication system is also called a 'beyond 4G network' or a 'post long-term evolution (LTE) system'.

It is considered that the 5G communication system will be implemented in millimeter wave (mmWave) bands, e.g., 60 GHz bands, so as to accomplish higher data rates. To reduce propagation loss of radio waves and increase a transmission distance, a beam forming technique, a massive multiple-input multiple-output (MIMO) technique, a full dimensional MIMO (FD-MIMO) technique, an array antenna technique, an analog beam forming technique, and a large scale antenna technique are discussed in 5G communication systems.

In addition, in 5G communication systems, development for system network improvement is under way based on advanced small cells, cloud radio access networks (RANs), ultra-dense networks, a device-to-device (D2D) communication, a wireless backhaul, a moving network, a cooperative communication, coordinated multi-points (CoMP), reception-end interference cancellation, and the like.

In the 5G system, a hybrid frequency shift keying (FSK) and quadrature amplitude modulation (QAM) (FQAM) and a sliding window superposition coding (SWSC) as an advanced coding modulation (ACM) scheme, and a filter bank multi carrier (FBMC) scheme, a non-orthogonal multiple Access (NOMA) scheme, and a sparse code multiple access (SCMA) scheme as an advanced access technology have been developed.

The Internet, which is a human centered connectivity network where humans generate and consume information, is now evolving to the internet of things (IoT) where distributed entities, such as things, exchange and process information without human intervention. The internet of everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies, such as a sensor network, MTC, and M2M communication may be implemented by beamforming, MIMO, and array antennas. Application of a cloud RAN as the above-described Big Data processing technology may also be considered to be as an example of convergence between the 5G technology and the IoT technology.

Generally, if data is transmitted and received between a transmitter and a receiver in a communication system, a data error may occur due to noise existing in a communication channel between the transmitter and the receiver. Various encoding schemes have been proposed to correct the data error occurred due to the communication channel in the receiver, and representative schemes among the various encoding schemes includes an error detection code scheme, an error correcting code (ECC) scheme, and/or the like.

More particularly, an error correction code scheme used in a communication between the transmitter and the receiver is also called a channel code scheme. Herein, in the error correction code scheme, the transmitter adds redundant bits to data bits which the transmitter intends to transmit to generate an error correction code, and transmits the generated error correction code, and the receiver receives the error correction code, and performs a decoding operation for correcting an error occurred in the data bits based on the redundant bits.

Meanwhile, the error correction code scheme includes various schemes, for example, a convolutional code scheme, a turbo code scheme, and a low density parity check (LDPC) code scheme, a polar code scheme, and/or the like. More particularly, the turbo code, the LDPC code, and the polar code are excellent codes having performance which almost approaches a theoretical channel capacity, so the turbo code, the LDPC code, and the polar code are used in various communication systems.

The polar code scheme among the various error correction code schemes has been theoretically proven to achieve a point-to-point channel capacity with relatively low complexity based on a channel polarization phenomenon which occurs in successive cancellation (SC) decoding.

In addition, it has been verified that performance of the polar code scheme is also excellent when SC-list (SCL) decoding, and/or the like are used. More particularly, in the polar code scheme, if a concatenated outer code, such as, for example, a cyclic redundancy check (CRC) code and SCL decoding are used, it has been verified that performance of the polar code scheme is better than performance of other existing channel code schemes.

Accordingly, various communication systems, such as, for example, a third generation partnership project (3GPP) new radio (NR) system, and/or the like use the polar code scheme.

The above information is presented as background information only to assist with an understanding of the disclosure. No determination has been made, and no assertion is made, as to whether any of the above might be applicable as prior art with regard to the disclosure.

SUMMARY

Generally, a general channel encoding scheme, such as a linear code scheme exhibits a trade-off between an achievable error correction capability and an achievable error detection capability. Herein, the error correction capability refers to a capability that a channel code itself may correct an error occurred in a channel, and/or the like, and the error detection capability refers to a capability of identifying whether an error occurs. Based on the error detection capability, if an error occurs, unnecessary next processes are prevented and retransmission may be requested.

Generally, a channel code, such as a turbo code, a low density parity check (LDPC) code, a polar code, and the like, is classified as an error correction code, and the channel code is generally designed to have a large error correction capability. However, the LDPC code also supports its own error detection according to a characteristic of a decoding operation. Generally, error detection is achieved using a separate error detection code, such as a cyclic redundancy check (CRC) code, and the like.

However, in an actual communication system, an error detection capability may be low because a CRC code of a relatively small size is used, or because a part of a CRC code is used for error correction as in CRC-aided successive-cancellation list (CA-SCL) decoding. Like this, if the error detection capability is low, an unnecessary next process is performed based on information including an error, thereby generating fatal load on an entire system.

If an additional error detection operation is performed to prevent such an issue, much higher cost needs to be paid compared to a case of using a general error detection code scheme. Therefore, in a communication system, it is important to effectively use a channel code scheme and an error detection code scheme in consideration of an error correction capability and an error detection capability.

Aspects of the disclosure are to address at least the above-mentioned problems and/or disadvantages and to provide at least the advantages described below. Accordingly, an aspect of the disclosure is to provide a device and a method to transmit/receive a signal based on a polar code in a communication system.

Another aspect of the disclosure is to provide a device and a method to transmit/receive a signal in consideration of error detection performance and error correction performance in a communication system.

Another aspect of the disclosure is to provide a device and a method to use at least part of parity bits of an outer code for error detection in a communication system.

Another aspect of the disclosure is to provide a device and a method to use at least part of parity bits of an outer code for error correction in a communication system.

Another aspect of the disclosure is to provide a device and a method to adaptively adjust parity bits of an outer code used for error correction and parity bits of the outer code used for error detection in a communication system.

Additional aspects will be set forth in part in the description which follows and, in part, will be apparent from the description, or may be learned by practice of the presented embodiments.

In accordance with an aspect of the disclosure, a method of a receiving device in a communication system is provided. The method includes receiving a signal, and decoding the received signal based on a polar decoding scheme which is based on a successive cancellation (SC) scheme to estimate an information sequence, wherein, in the polar decoding scheme, a second number of parity bits among a first number of parity bits of an outer code included in an input bit sequence to a polar encoder are used in an error detection operation, and a third number of parity bits among the first number of parity bits are used in an error correction operation.

In accordance with another aspect of the disclosure, a method of a receiving device in a communication system is provided. The method includes receiving a signal, and decoding the received signal based on a polar decoding scheme which is based on a successive cancellation-list (SCL) scheme which uses a first number of lists to estimate an information sequence, wherein, in the polar decoding scheme, a third number of parity bits among a second number of parity bits of an outer code included in an input bit sequence to a polar encoder are used in an error detection operation, and the error detection operation is performed for a fourth number of lists among the first number of lists.

In accordance with another aspect of the disclosure, a receiving device in a communication system is provided. The receiving device includes a receiver configured to receive a signal, and a polar decoder configured to decode the received signal based on a polar decoding scheme which is based on a successive cancellation (SC) scheme to estimate an information sequence, wherein, in the polar decoding scheme, a second number of parity bits among a first number of parity bits of an outer code included in an input bit sequence to a polar encoder are used in an error detection operation, and a third number of parity bits among the first number of parity bits are used in an error correction operation.

In accordance with another aspect of the disclosure, a receiving device in a communication system is provided. The receiving device includes a receiver configured to receive a signal, and a polar decoder configured to decode the received signal based on a polar decoding scheme which is based on a successive cancellation-list (SCL) scheme which uses a first number of lists to estimate an information sequence, wherein, in the polar decoding scheme, a third number of parity bits among a second number of parity bits of an outer code included in an input bit sequence to a polar encoder are used in an error detection operation, and the error detection operation is performed for a fourth number of lists among the first number of lists.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
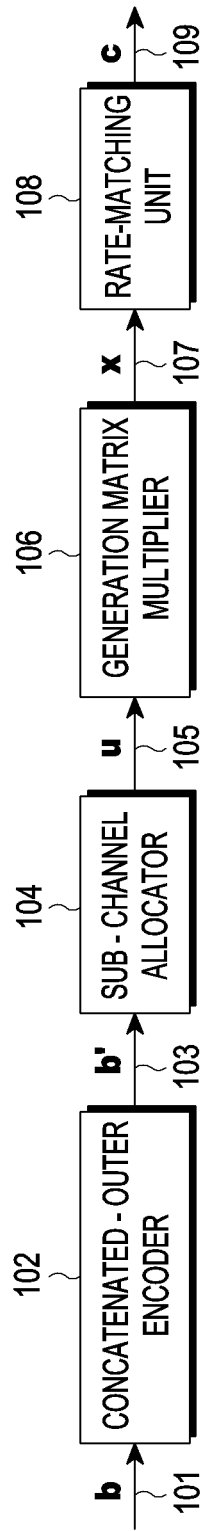
FIG. 1 schematically illustrates an inner structure of a transmitting device in a communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In describing various embodiments of the disclosure, a description of technical content well known in the technical field to which the disclosure belongs and which is not directly related to the disclosure will be omitted. This is to more clearly convey subject matter of the disclosure without obscuring the subject matter of the disclosure by omitting unnecessary description.

For the same reason, in the accompanying drawings, some components are highlighted, omitted, or schematically illustrated. In addition, a size of each component does not entirely reflect an actual size. The same reference numerals are assigned to the same or corresponding elements in each drawing.

Advantages and features of the disclosure and a method of achieving them will be apparent with reference to embodiments described below in detail together with the accompanying drawings. However, the disclosure is not limited to embodiments described below, and may be implemented in various different forms. Embodiments of the disclosure are provided merely to make the disclosure complete, and to fully inform the scope of the disclosure to those skilled in the art to which the disclosure belongs, and the disclosure is only defined by the scope of claims. The same reference numerals refer to the same components throughout the specification.

Hereinafter, various embodiments will be described in detail with reference to the accompanying drawings. At this time, it will be noted that the same components in the accompanying drawings are denoted by the same reference numerals as possible. In addition, it will be noted that the accompanying drawings in the disclosure are provided to help understanding of the disclosure, and the disclosure is not limited to the form or arrangement illustrated in the accompanying drawings in the disclosure. In addition, a detailed description of known functions and components that may obscure the subject matter of the disclosure will be omitted. It will be noted that in the following description, only parts necessary to understand operations according to various embodiments of the disclosure are described, and a description of other parts will be omitted so as not to distract the subject matter of the disclosure.

A polar code is an error correction code. Further, the polar code is an error correction code which has relatively low encoding and decoding complexity and has been proven to achieve a channel capacity as a data transmission limit in all binary discrete memoryless channels (B-DMCs). The polar code is advantageous in terms of error correction performance and decoding complexity when a code of a relatively short length is transmitted, compared to other codes which approach a channel capacity, such as, for example, a turbo code, a low density parity check (LDPC) code, and the like. Due to these benefits, various communication systems, such as, for example, a 3rd generation partnership project (3GPP) new radio (NR) system, and the like, use the polar code. For example, the 3GPP NR system uses the polar code when transmitting control information of a relatively short length.

Meanwhile, the polar code is a channel code which is based on a characteristic called channel polarization.

In a polar encoding system based on the polar code, an encoder multiplies a coded input bit vector of a length N by an N×N generation matrix which is defined by the polar code to generate a coded output bit vector of a length N. Here, the generation matrix is obtained by applying a Kronecker product to a 2×2 kernel matrix whose size is relatively small. It will be assumed that each of coded output bits included in the coded output bit vector passes through a B-DMC. In addition, a received symbol vector is decoded based on a successive cancellation (SC) scheme in a decoder.

If an encoding scheme which is based on the generation matrix and an encoding scheme which is based on an SC scheme are used, it may be regarded that each of bit channels between an input end of the encoder and an output end of the decoder is converted into a polarized virtual channel. For example, some of virtual channels corresponding to the bit channels between the input end of the encoder and the output end of the decoder are channels which may be regarded as channels having no error, i.e., channels which may be regarded as channels whose channel capacities are 1, and remaining virtual channels are channels which may be regarded as channels in which information may not be recovered, i.e., channels which may be regarded as channels whose channel capacities are 0.

Therefore, a value of a coded output bit which passes through a channel whose channel capacity is 0 at the input end of the encoder is fixed to a value promised by a transmitter and a receiver, and information bit which is intended to transmit is mapped to a coded output bit which passes through a channel whose channel capacity is 1. Herein, the coded output bit to which the fixed value is mapped for the channel whose channel capacity is 0 will be referred to as a frozen bit. In this way, the polar encoding system may achieve a total channel capacity which may be obtained from a given physical channel.

An example of an inner structure of a transmitting device in a communication system according to an embodiment of the disclosure will be described with reference to FIG. 1.

FIG. 1 schematically illustrates an inner structure of a transmitting device in a communication system according to an embodiment of the disclosure.

Prior to a description of FIG. 1, an inner structure of a transmitting device illustrated in FIG. 1 may be an inner structure of a transmitting device related to an encoding process which is based on a polar code. Some of a series of operations included in an encoding process described in FIG. 1 may be omitted if necessary, for example, according to a system requirement and a system characteristic, or a new operation may be included in the encoding process described in FIG. 1.

Referring to FIG. 1, the transmitting device illustrated may be one of a base station (BS), a node B, an evolved node B (eNB), a next generation node B (gNB), and/or the like.

The transmitting device illustrated in FIG. 1 may be one of a terminal, a user equipment (UE), a mobile station (MS), and/or the like. Further, the transmitting device illustrated in FIG. 1 may be one of various types of electronic devices. Electronic devices according to various embodiments of the disclosure may include, for example, a computer device, a portable communication device (e.g., a smartphone), a portable multimedia device, a portable medical device, a camera, a wearable device, or a home appliance. According to various embodiments of the disclosure, the electronic devices are not limited to those described above.

Referring to FIG. 1, it will be assumed that the number of information bits which the transmitting device intends to transmit, for example, the number of bits included in an information bit sequence is A, and the number of codeword bits included in a codeword bit sequence to be transmitted through a channel after encoding is performed is E.

First, an information bit sequence $b=\{b_0, b_1, \ldots, b_{A-1}\}$ 101 which the transmitting device intends to transmit is given. In one embodiment of the disclosure, the information bit sequence may be all information which the transmitting device intends to transmit, for example, some of a code block, for example, a code block segment.

The information bit sequence b 101 is inputted to a concatenated-outer encoder 102, and the concatenated-outer encoder 102 encodes the information bit sequence b 101 based on an outer code scheme to generate a bit sequence $b'=\{b'_0, b'_1, \ldots, b'_{K-1}\}$ 103. Here, the outer code scheme may be used for increasing performance of a decoder which performs decoding by considering a plurality of codeword bit sequence candidate groups, such as a sequential cancellation-list (SCL) decoding scheme of a polar code scheme.

The SCL decoding scheme will be described in detail below, so a detailed description thereof will be omitted herein.

Meanwhile, an outer code concatenated to a polar code may include an error detection code, such as a cyclic redundancy check (CRC) code, and an error correction code, such as a Bose, Chaudhuri, Hocque-nghem (BCH) code, a parity check (PC) code, a convolutional code, and/or the like. Herein, one outer code may be used, or two or more outer codes may be used together. For example, a 3GPP NR system uses a polar code scheme for control information, and the number of outer codes to be used is determined based on a length of an information bit sequence in a polar code scheme used in the 3GPP NR system. In the 3GPP NR system, for example, a CRC code is used as the outer code.

For example, in a 3GPP NR uplink system, if a length of an information bit sequence is longer than or equal to a set length, for example, if the number of bits included in the information bit sequence is greater than or equal to 20, one outer code, for example, an 11-bit CRC code is used. Alternatively, if the length of the information bit sequence is shorter than the set length, for example, if the number of bits included in the information bit sequence is less than or equal to 19, two outer codes, for example, a 3-bit PC code and a 6-bit CRC code are used.

Herein, it will be assumed that a length of parity bits generated by one or more outer codes is expressed by B, and a length of a codeword generated by an outer code scheme is expressed by K (K=A+B). Here, a $B_{PC}$-bit PC code represents a PC code by which $B_{PC}$ parity bits are generated, and a $B_{CRC}$-bit CRC code represents a CRC code by which $B_{CRC}$ parity bits are generated. In this case, a PC codeword bit sequence includes $B_{PC}$ parity bits, and a CRC codeword bit sequence includes $B_{CRC}$ parity bits.

Meanwhile, the outer encoding may or may not be performed if necessary. Therefore, if the outer encoding is not performed, B=0, and a bit sequence b'(b'={b'$_0$, b'$_1$, ..., b'$_{K-1}$}) 103 outputted from the concatenated-outer encoder 102 is the same as the information bit sequence b (b'=b).

The bit sequence b' 103 outputted from the concatenated-outer encoder 102 is inputted to a sub-channel allocator 104, and the sub-channel allocator 104 maps the bit sequence b' 103 to a bit sequence u={u$_0$, u$_1$, ..., u$_{N-1}$} of a length N 105. Here, N represents a length of a mother polar code. In addition, N is a power of 2, and is determined as a value greater than K based on a predetermined criterion.

The bit sequence u 105 is an input bit sequence to a polar encoder, and K bits included in the bit sequence b' 103 are mapped to K bits among the N bits in the bit sequence u according to a set scheme and criterion. Herein, the polar encoder includes the sub-channel allocator 104 and a generation matrix multiplier 106.

The bits included in the bit sequence u may be interpreted as passing through sub-channels which are virtual channels having different qualities according to channel polarization by signal transmitting/receiving operation between a transmitting device and a receiving device. In various embodiments of the disclosure, a sub-channel may also be referred to as a split channel or a synthetic channel.

Accordingly, information related to reliability is used to map the bits included in the bit sequence b' to bits included in the bit sequence u which pass through sub-channels having excellent qualities. Herein, the information related to the reliability may include channel capacity of each sub-channel, for example, a symmetric capacity, a Bhatacharayya parameter, a result of density evolution, and/or the like. Because of this feature, an operation of mapping the bit sequence b' to the bit sequence u is also referred to as a sub-channel allocating operation.

In the sub-channel allocation operation, a bit included in the bit sequence u which is transmitted through a sub-channel to which the bits included in the bit sequence b' are not mapped is referred to as a frozen bit. A value of the frozen bit is fixed. In general, the value of the frozen bit is set to, for example, 0.

Meanwhile, in the sub-channel allocating operation, each of bits included in the bit sequence u which are transmitted through sub-channels to which the bits included in the bit sequence b' are mapped may be an unfrozen bit or a dynamic frozen (DF) bit according to a characteristic of a corresponding bit. Generally, each of at least one information bit and at least one parity bit of an outer-concatenated code, e.g., a CRC code may be an unfrozen bit, and each of at least one parity bit generated by another outer-concatenated code, e.g., a PC code may be a DF bit. The DF bit will be described in detail below, so a detailed description thereof will be omitted herein.

Meanwhile, the bit sequence u is inputted to the generation matrix multiplier 106. The generation matrix multiplier 106 multiplies the bit sequence u by a generation matrix G which corresponds to a predetermined polar code to generate a coded bit sequence x 107 of a length N. Here, the bit sequence x 107 is an output bit sequence of the polar encoder, i.e., a coded output bit sequence.

Meanwhile, in various embodiments of the disclosure, the generation matrix G may be defined as Equation 1.

$$G = B_N F^{\otimes \log_2 N} \qquad \text{Equation 1}$$

In Equation 1, $$F = \begin{bmatrix} 1 & 0 \\ 1 & 1 \end{bmatrix},$$

and a superscript ⊗ n operation denotes a Kronecker power of n times. For example, $$F^{\otimes 2} = \begin{bmatrix} F & 0 \\ F & F \end{bmatrix} \text{ and } F^{\otimes 3} = \begin{bmatrix} F^{\otimes 2} & 0 \\ F^{\otimes 2} & F^{\otimes 2} \end{bmatrix}.$$

In Equation 1, $B_N$ denotes a bit-reversal permutation matrix of a size N×N. For example, if a bit sequence {a$_0$, a$_1$, a$_2$, a$_3$, a$_4$, a$_5$, a$_6$, a$_7$} of a length 8 is multiplied by a 8×8 bit-reversal permutation matrix $B_s$, a bit sequence {a$_0$, a$_1$, a$_2$, a$_3$, a$_4$, a$_5$, a$_6$, a$_7$} that indices of bits included in the bit sequence of the length 8 are bit-reversal permuted is generated.

Meanwhile, in various communication systems including a 3GPP NR system, a relatively simple form of generation matrix G that the bit-reversal permutation matrix $B_N$ is excluded is considered. In this case, the generation matrix G that the bit-reversal permutation matrix $B_N$ is excluded may be expressed as Equation 2.

$$G = F^{\otimes \log_2 N} \qquad \text{Equation 2}$$

In various embodiments of the disclosure, unless otherwise described, it will be assumed that the generation matrix G is $G = F^{237 \ \log_2 N}$ as expressed in Equation 2.

The bit sequence x is inputted into a rate-matching unit 108, and the rate-matching unit 108 performs a rate-matching operation on the bit sequence x to generate a bit sequence of a length E, i.e., a final codeword bit sequence. Herein, the bit sequence outputted from the rate-matching unit 108 is expressed as a transmission bit sequence c 109. In addition, the bit sequence x may be re-adjusted to improve a performance of a polar code according to rate-matching.

Meanwhile, in a polar encoding system of the 3GPP NR system, an interleaving operation may be performed for the bit sequence x. For example, the bit sequence x is interleaved in a unit of 32 sub-blocks, and interleaved bit sequences are stored in a circular buffer. Thereafter, the interleaved bit sequences stored in the circular buffer are sequentially extracted, and then generated as the final codeword bit sequence of the length E.

In addition, if the length E of the final codeword bit sequence is shorter than a length N of the mother code of the polar code scheme, for example, one of a puncturing operation or a shortening operation is performed on the bit sequence b'. In this case, some sub-channels may not be allocated for an information bit in the sub-channel allocating operation due to a punctured or shortened bit. If the length E of the final codeword bit sequence is longer than the length N of the mother code of the polar code scheme, for example, a repetition operation is performed on the bit sequence b'.

Although the concatenated-outer encoder 102, the sub-channel allocator 104, the generation matrix multiplier 106, and the rate-matching unit 108 are described as separate units in FIG. 1, it is to be understood that at least two of the concatenated-outer encoder 102, the sub-channel allocator 104, the generation matrix multiplier 106, and the rate-matching unit 108 may be incorporated in one unit, and the concatenated-outer encoder 102, the sub-channel allocator 104, the generation matrix multiplier 106, and the rate-matching unit 108 may be implemented with at least one processor.

An example of an inner structure of a transmitting device in a communication system according to an embodiment of the disclosure has been described with reference to FIG. 1, and an example of an inner structure of a receiving device in a communication system according to an embodiment of the disclosure will be described with reference to FIG. 2.

Figure 2:
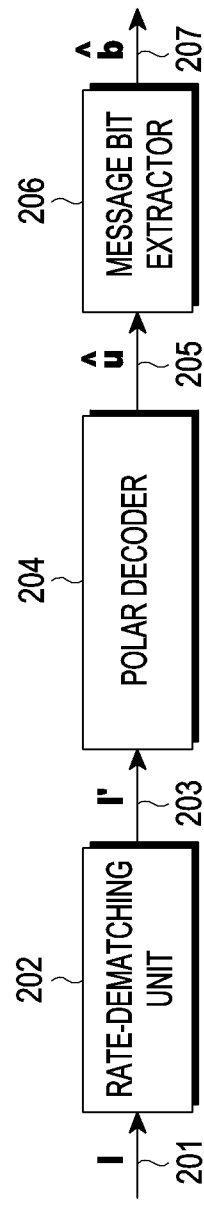
FIG. 2 schematically illustrates an inner structure of a receiving device in a communication system according to an embodiment of the disclosure.

FIG. 2 schematically illustrates an inner structure of a receiving device in a communication system according to an embodiment of the disclosure.

Prior to a description of FIG. 2, an inner structure of a receiving device illustrated in FIG. 2 may be an inner structure of a receiving device related to a decoding process which is based on a polar code. Some of a series of operations included in a decoding process described in FIG. 2 may be omitted if necessary, for example, according to a system requirement and a system characteristic, or a new operation may be included in the decoding process described in FIG. 2.

Referring to FIG. 2, the receiving device may be one of a terminal, a UE, an MS, and/or the like. Further, the receiving device illustrated in FIG. 2 may be one of various types of electronic devices. Electronic devices according to various embodiments of the disclosure may include, for example, a computer device, a portable communication device (e.g., a smartphone), a portable multimedia device, a portable medical device, a camera, a wearable device, or a home appliance. According to various embodiments of the disclosure, the electronic devices are not limited to those described above.

The receiving device illustrated in FIG. 2 may be one of a BS, a node B, an eNB, a gNB, and/or the like.

Referring to FIG. 2, a demodulation operation which is based on a demodulation scheme which corresponds to a modulation scheme applied in a transmitting device is performed on a signal received in a receiving device, and probability information corresponding to a transmission bit sequence 109 transmitted in the transmitting device is obtained by performing the demodulation operation.

The probability information may be, for example, one of a probability vector, a likelihood ratio (LR), a log-likelihood ratio (LLR), and the like. In various embodiments of the disclosure, unless otherwise mentioned, it will be assumed that the probability information is the LLR. In addition, in various embodiments of the disclosure, for example, it will be assumed that an LLR-based receiver is used, but it will be noted that various embodiments of the disclosure are not limited to the LLR-based receiver. In addition, it will be assumed that an LLR sequence corresponding to the transmission bit sequence c 109 is, for example, $I=\{l_0, l_1, \ldots, l_{E-1}\}$ 201.

The LLR sequence I 201 of the length E is inputted to a rate-dematching unit 202, and the rate-dematching unit 202 performs a rate-dematching operation on the LLR sequence I to generate an LLR sequence $I'=\{l'_0, l'_1, \ldots, l'_{N-1}\}$ of a length N 203. If a puncturing operation is performed in a rate-matching unit 108 in the transmitting device, an LLR value for a bit punctured according to the puncturing operation is determined as, for example, "0". Alternatively, if a shortening operation is performed in the rate-matching unit 108 in the transmitting device, an LLR value for a bit shortened according to the shortening operation is determined as, for example, a maximum value of an LLR value which corresponds to a bit value "0". In addition, if a repetition operation is performed in the rate-matching unit 108 in the transmitting device, an LLR value for a corresponding bit is determined by combining all LLR values which correspond to bits repeated according to the repetition operation.

The LLR sequence I' 203 of the length N is inputted to a polar decoder 204. The polar decoder 204 performs a decoding operation which is based on a SC scheme-based decoding scheme, e.g., an SC decoding scheme. In various embodiments of the disclosure, an SCL scheme will be assumed as an example of the SC decoding scheme. However, it will be noted that various embodiments of the disclosure are not limited to a decoding scheme which is based on the SCL scheme, i.e., an SCL decoding scheme.

Meanwhile, all SC decoding schemes including the SCL decoding scheme decode sequentially bits included in a bit sequence u bit by bit according to an order of bit indices of the bits included in the bit sequence u inputted to a polar encoder in the transmitting device. Accordingly, the polar decoder 204 performs a decoding operation on each bit included in the bit sequence u according to a bit index order of the bit sequence u, i.e., in an order of $u_0, u_1, \ldots, u_{N-1}$ to estimate a value of each bit. Herein, calculation of a probability or a value equivalent to the probability of each bit included in the bit sequence u and estimation of a bit value based on this are performed based on estimated bit values of bits preceding a corresponding bit.

For example, when a bit $u_1$ is decoded, bits decoded before the bit $u_i$, i.e., a partial estimated bit sequence $(\hat{u}_0, \ldots, \hat{u}_{i-1})$ as estimated values for a partial bit sequence $(u_0, \ldots, u_{i-1})$, accumulated values of probability information or a value equivalent to the probability information for the partial bit sequence $(u_0, \ldots, u_{i-1})$, and/or the like are used. Herein, the partial bit sequence $(\hat{u}_0, \ldots, \hat{u}_{i-1})$ will be referred to as a list or a path. In addition, accumulated probability information or a value equivalent to the accumulated probability information which is calculated according to a decoding operation for each path will be referred to as a path-metric (PM).

The polar decoder 204 represents a scheme of performing decoding while maintaining a list $(\hat{u}_0, \ldots \hat{u}_{i-1})$ as many as a predetermined maximum list size L when decoding a bit $u_i$. For example, the polar decoder 204 calculates probability information for a bit value of the bit $u_i$, i.e., probability information for 0 or probability information for 1, based on a list $(\hat{u}_0, \ldots, \hat{u}_{i-1})$ maintained in a current decoding operation. And, the polar decoder 204 calculates PMs for 2L lists by updating the probability information for the bit value of the bit $u_i$, i.e., the probability information for 0 or the probability information for 1, or a value equivalent to the probability information for 0 or a value equivalent to the probability information for 1 to a PM for each list $(\hat{u}_0, \ldots, \hat{u}_{i-1})$ which is considered when calculating the probability information for the bite $u_i$. If the bit $u_i$ is a frozen bit, an estimated value $\hat{u}_i$ for the bit $u_i$ is determined as a bit value, e.g., "0", which the transmitting device and the receiving device already know, that is, which the transmitting device and the receiving device promise each other. If the bit $u_i$ is an unfrozen bit, L lists which are determined to have higher probabilities among the total 2L lists based on a PM are selected.

In this way, the polar decoder 204 performs a decoding operation while maintaining a total L of lists whenever each bit is decoded. Then, if decoding of all bits included in the bit sequence u is completed, the polar decoder 204 selects a candidate codeword bit sequence having the highest probability among finally obtained L lists, i.e., L candidate codeword bit sequences based on a PM. If L is set to 1, the polar decoder 204 operates in the same way as a decoder which is based on an SC scheme.

In addition, error correction performance may be improved using a scheme which is based on a concatenated-outer code while the SCL decoding operation is performed or after the SCL decoding operation is completed. Herein, a scheme of improving the error correction performance will be described in detail below, so a detailed description thereof will be omitted herein.

A bit sequence, i.e., the estimated bit sequence $\hat{u}=(\hat{u}_0, \hat{u}_1, \ldots, \hat{u}_{N-1})$ 205 outputted from the polar decoder 204 is inputted to a message bit extractor 206. The message bit extractor 206 extracts message bits at positions which correspond to sub-channels allocated in a sub-channel allocator 104 in the transmitting device. The message bit extractor 206 outputs a sequence including the extracted message bits, i.e., a bit sequence $\hat{b}$ 207 as an estimated information sequence.

Although the rate-dematching unit 202, the polar decoder 204, and the message bit extractor 206 are described as separate units in FIG. 2, it is to be understood that at least two of the rate-dematching unit 202, the polar decoder 204, and the message bit extractor 206 may be incorporated in one unit, and the rate-dematching unit 202, the polar decoder 204, and the message bit extractor 206 may be implemented with at least one processor.

Meanwhile, a polar decoder may improve error correction performance using a concatenated-outer code, and a representative scheme thereof is a CRC-aided SCL (CA-SCL) decoding scheme which uses a concatenated-outer-code, for example, a CRC code. The CA-SCL scheme will be described in detail as follows.

Firstly, when the polar decoder performs an SCL decoding operation, a total of lists are generated. In a general SCL decoding operation, one of the L list is selected based on a PM.

Meanwhile, an important issue to be considered in a polar decoding scheme is that a Hamming distance between codeword bit sequences generated due to a characteristic of a polar code itself is quite short, so there is a relatively high probability that a corresponding codeword bit sequence is misjudged as a different codeword bit sequence.

Even though a size of a list L increases due to this characteristic of the polar code, performance improvement of the SCL decoding scheme is limited to a certain level which is a maximum-likelihood (ML) bound. However, if an information bit sequence corresponding to each list is encoded based on a concatenated-CRC encoding scheme, the polar decoder may check validity of a finally obtained list using a CRC check. As a result, this may be interpreted that concatenation of a CRC code serves to increase a Hamming distance between concatenated codeword bit sequences.

If the CA-SCL decoding scheme is used, the polar decoder 204 uses the CRC check result and a PM when selecting one of L lists after completing a decoding operation. For example, the polar decoder 204 selects a list which satisfies the CRC check for the concatenated-CRC code and which is determined to have the highest probability based on a PM value among the L lists as an estimated bit sequence $\hat{u}=(\hat{u}_0, \hat{u}_1, \ldots, \hat{u}_{N-1})$ 205.

In this way, a fact of concatenating the CRC code to the polar code increases an effective minimum distance of the polar code, thereby greatly improving performance of the SCL decoding scheme. Although the CRC code is described as the outer code, various codes, such as a BCH code, a PC code, a convolutional code, and/or the like as well as the CRC code may be used as the outer code.

Meanwhile, in order to use parity bits included in an outer code in an SCL decoding scheme, the outer code is designed such that the parity bits included in the outer code are bits decoded first compared to other bits in a decoding operation which is based on the SCL decoding scheme. For example, the outer code is designed such that a decoding order for the parity bits included in the outer code precedes a decoding order for the other bits.

Meanwhile, each of the parity bits does not include information, so each of the parity bits may be classified as a frozen bit, but bit values of the parity bits change according to values of bits preceding the parity bits in a bit sequence which is an input bit sequence for a polar encoder, so each of the parity bits will be referred to as a DF bit. For example, the DF bit is a parity bit according to outer encoding which is mapped to the bit sequence u, and the DF bit is generated as a function of bits having bit indices less than a bit index of the DF bit.

Meanwhile, the DF bit may be mathematically interpreted as a bit generated causally in the bit sequence u. The DF bit means a parity bit generated by one or more linear codes which are concatenated to the polar code or included in the polar code, and the DF bit may include a parity bit generated by a PC code, a parity bit generated by a convolutional code, and/or the like. Here, the parity bit generated by the PC code may be referred to as a "PC bit".

Generally, a parity bit included in a (appended) CRC code which is located at the end of the bit sequence u, that is, which has the greatest bit index among the bit indices of the bit sequence u may also be regarded as a DF bit in some cases. In addition, some or all of parity bits generated by a distributed CRC (D-CRC) code used in a downlink of the 3GPP NR system may be also regarded as DF bits.

Herein, an example of a DF bit process for generating a DF bit will be described.

Firstly, it will be assumed that a DF bit is mapped to the $i^{th}$ bit $u_i$ among bits included in a bit sequence $u=(u_0, u_1, \ldots, u_{N-1})$ in a sub-channel allocating process. Herein, the DF bit may be a parity bit of an outer code, for example, a PC code, as described above. The DF bit $u_i$ is generated by a linear equation defined by at least one of bits $\{u_0, \ldots, u_{i-1}\}$ which are mapped to (or which will be mapped to) a bit #0 to bit #i−1 among bits included in the bit sequence u.

For example, a DF bit $u_6$ mapped (or to be mapped) to a bit #6 among the bits included in the bit sequence u may be a modulo-2 sum $u_3 \oplus u_5$ of bits mapped (or to be mapped) to a bit #3 and a bit #5 among the bits included in the bit sequence u. Herein, each of bits related to generation of the DF bit among the bits included in the bit sequence u may be a frozen bit, an unfrozen bit, or another DF bit.

However, none of bits $\{u_0, \ldots, u_{N-1}\}$ mapped (or to be mapped) after a bit #7 among the bits included in the bit sequence u is related to generation of the DF bit mapped (or to be mapped) to the bit #6.

In various embodiments of the disclosure, a DF bit generating process as described above may be performed based on a location of a bit to which a DF bit will be mapped before a sub-channel allocating process, or based on a location of a bit to which the DF bit is mapped during the sub-channel allocating process.

As described above, a polar decoder included in a receiving device performs an SCL decoding operation to sequentially decode bits included in a bit sequence u bit by bit according to a bit index.

If a bit $u_i$ to be decoded at a corresponding time point is a DF bit, the polar decoder operates as follows.

First, the polar decoder considers L lists in the same way as in a case that a general SCL decoding scheme is used. The polar decoder calculates an estimated value $\hat{u}_i = f_{PC}(\hat{u}_0, \ldots, \hat{u}_{i-1})$ for the DF bit based on each list $(\hat{u}_0, \ldots, \hat{u}_{i-1})$ and a linear equation for the DF bit, for example, a linear function $f_{PC}(\cdot)$. The polar decoder updates each list $(\hat{u}_0, \ldots, \hat{u}_{i-1})$ to $(\hat{u}_0, \ldots, \hat{u}_{i-1}, \hat{u}_i = PC(u_i))$. Herein, a PM for a corresponding list is updated based on a set scheme. It may be understood that an estimated value for a general unfrozen bit is determined by a probability-based metric, i.e., a PM, while an estimated value for the DF bit is determined by a bit estimated before the DF bit and a set linear equation.

It may be understood that decoding for a DF bit is not performed based on a PM, and is similar to decoding for a frozen bit in an aspect that an estimated value for the DF bit is directly determined.

The DF bit is allowed to prune an inaccurate list at a bit-level by applying an effect of an outer code concatenated to a polar code during an SCL decoding process to select an accurate list, and perform a next decoding operation on the accurate list. This operation may increase a minimum distance of a codeword bit sequence similar to a CRC code concatenated to the polar code thereby improving error correction performance.

An example of a binary tree used by a polar decoder which is based on an SC scheme according to an embodiment of the disclosure will be described with reference to FIG. 3A.

Figure 3A:
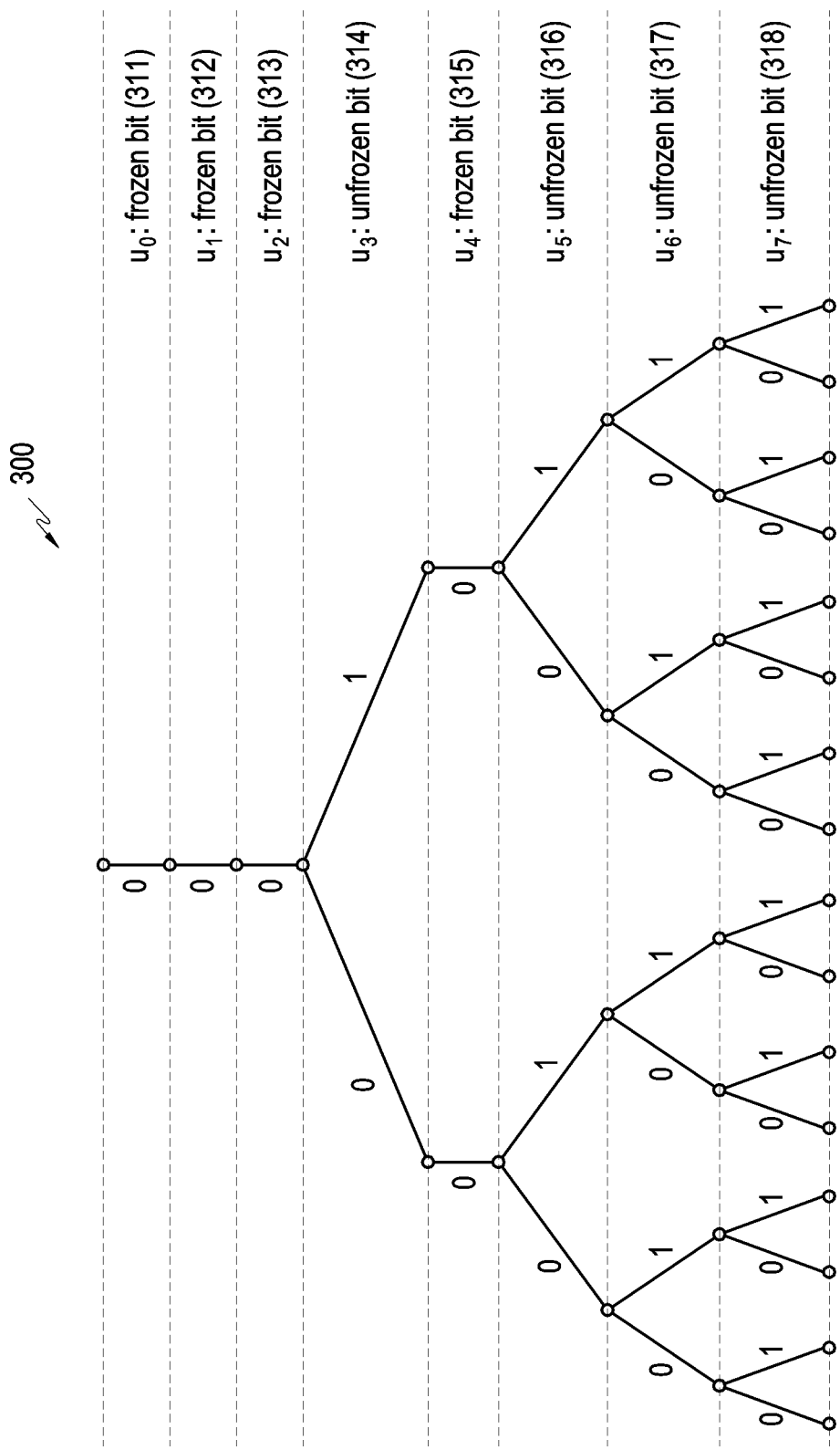
FIG. 3A schematically illustrates a binary tree used by a polar decoder which is based on an SC scheme according to an embodiment of the disclosure.

FIG. 3A schematically illustrates a binary tree used by a polar decoder which is based on an SC scheme according to an embodiment of the disclosure.

Referring to FIG. 3A, it will be assumed $\{u_3, u_5, u_6, u_7\}$ that are unfrozen bits and $\{u_0, u_1, u_2, u_4\}$ are frozen bits in a bit sequence $u=(u_0,u_1,u_2,u_3,u_4,u_5,u_6,u_7)$ for a polar code of a length 8. It will be noted that each of bits included in the bit sequence u is expressed using reference numerals 311 to 318 in FIG. 3A.

A binary tree illustrated in FIG. 3A shows an operation 300 of determining an estimated value of each bit according to bit indices of the bits included in the bit sequence u using an SC scheme-based decoding scheme, such as an SCL decoding scheme, and/or the like.

A value of a frozen bit is fixed to a set value, for example, "0", the value of the frozen bit in the binary tree is fixed to 0 without branching to 0 and 1.

Alternatively, a value of an unfrozen bit may be 0 or 1, so the value of the unfrozen bit branches to two cases of 0 and 1 in the binary tree. When this rule is applied to each of the bits included in the bit sequence u, a final binary tree for a polar decoder which is based on the SC scheme is generated.

A polar decoder which is based on the SC scheme, such as the SCL decoding scheme, and the like, selects one of a plurality of paths included in the binary tree based on a probability, and outputs the selected path as a decoding result of the polar decoder. Here, the number of unfrozen bits including information is 4, the number of paths included in the binary tree, i.e., the number of codeword bit sequences is 16 ($2^4$=16).

Another example of a binary tree used by a polar decoder which is based on an SC scheme according to an embodiment of the disclosure will be described with reference to FIG. 3B.

Figure 3B:
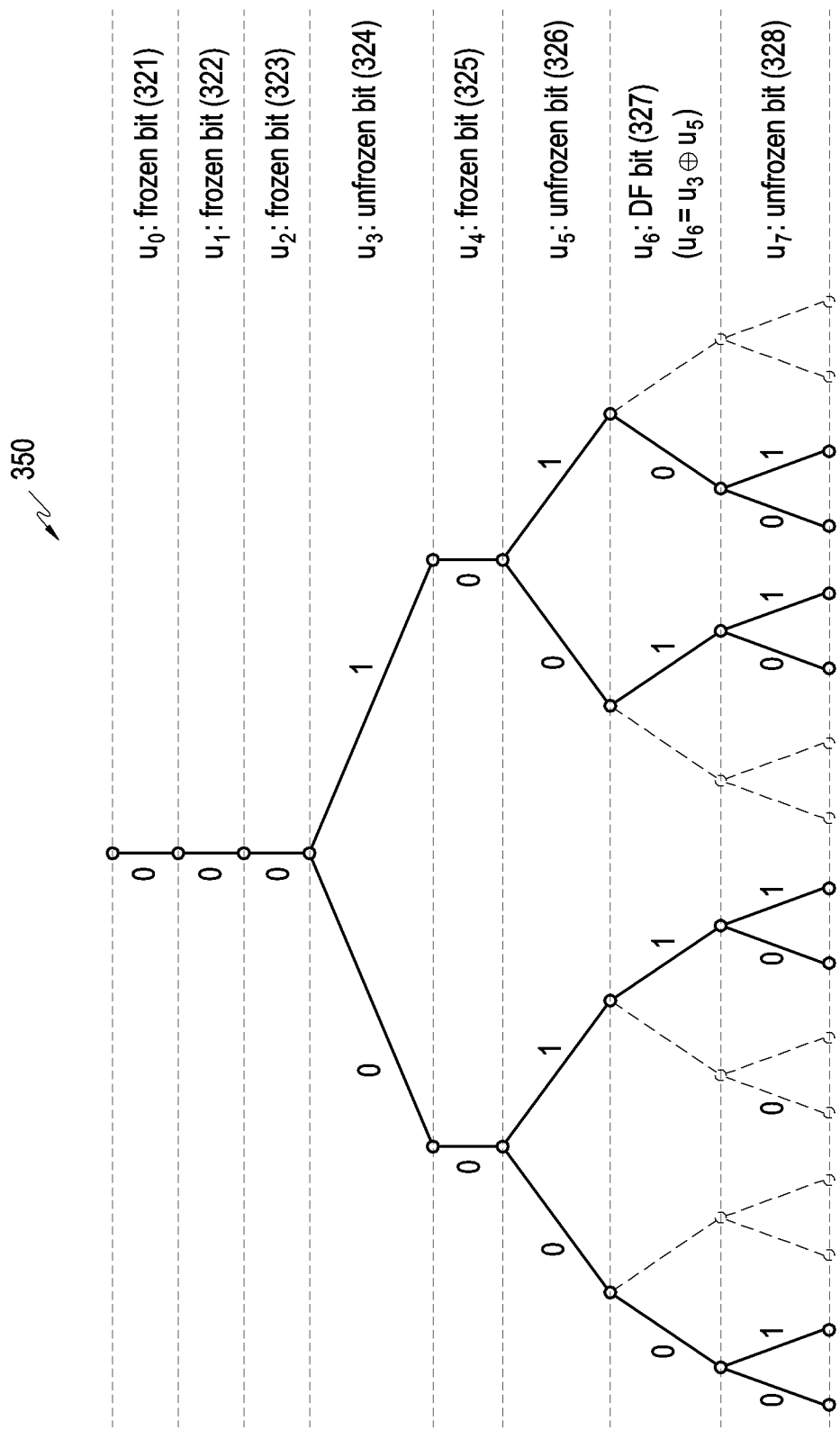
FIG. 3B schematically illustrates a binary tree used by a polar decoder which is based on an SC scheme according to an embodiment of the disclosure.

FIG. 3B schematically illustrates a binary tree used by a polar decoder which is based on an SC scheme according to an embodiment of the disclosure.

Referring to FIG. 3B, in a situation as described in FIG. 3A, it will be assumed that a bit #6 $u_6$ in a bit sequence $u=(u_0,u_1,u_2,u_3,u_4,u_5,u_6,u_7)$ is a DF bit 327, and the DF bit 327 is $u_3 \oplus u_5$. It will be noted that each of bits included in the bit sequence u is expressed using reference numerals 321 to 328 in FIG. 3B.

In a polar decoder based on an SC scheme, the bits included in the bit sequence u are sequentially decoded according to a bit index. Accordingly, $u_3$ and $u_s$ are decoded before $u_6 = u_3 \oplus u_5$ which is the DF bit 327.

On a binary tree 350 shown in FIG. 3B, values which a bit $u_6$ may have are limited by bit values of the $u_3$ and $u_s$. For example, on a path where $u_3$=0 and $u_s$=1 on binary tree 350, a value of the bit $u_6$ is bound to be $u_s \oplus u_5$=1.

Alternatively, on a path where $u_3$=1 and $u_5$=1 on the binary tree 350, a value of the bit $u_6$ is bound to be $u_3 \oplus u_5$=0. Accordingly, a path to which the bit $u_6$ branches on the binary tree 350 is determined based on values of the bit $u_3$ and the bit $u_s$ decoded before the bit $u_6$.

The polar encoder using an SC scheme-based decoding scheme, such as an SCL decoding scheme, and the like, selects one of these paths based on a probability, and outputs the selected path as a decoding result of the polar decoder.

The bit $u_6$ does not include information and is determined based on values of other bits, so there are 3 unfrozen bits including information, and the number of paths included in the binary tree 350, i.e., the number of codeword bit sequences is 8($2^3$=8).

Various embodiments of the disclosure propose a polar decoding scheme in a case that a polar code including $B_{DF}$ DF bits is used. Here, the $B_{DF}$ represents an integer which is greater than or equal to 1. Various embodiments of the disclosure propose a decoding operation of a polar code which uses one or more DF bits. In various embodiments of the disclosure, if necessary, a CRC code may be concatenated to the polar code, or the CRC code may not be concatenated to the polar code. As such, an example of a communication system in which the CRC code is concatenated to the polar code or the CRC code is not concatenated to the polar code if necessary is a 3GPP NR system.

In the 3GPP NR system, it is determined whether the CRC code is concatenated to the polar code based on a length of control information which is transmitted through an uplink. Herein, the control information will be transmitted through a physical uplink control channel (PUCCH) or a physical uplink shared channel (PUSCH), and the control information is encoded based on a polar encoding scheme. In the 3GPP NR system, for example, if the length of the control information, i.e., a length of an information bit sequence is greater than or equal to 12 and less than or equal to 19, a 6-bit CRC code and a 3-bit PC code are concatenated to the polar code.

Meanwhile, a polar decoder proposed in various embodiments of the disclosure uses at least one parity bit included in a PC codeword bit sequence concatenated to a polar codeword bit sequence while performing an SCL decoding operation, and uses at least one parity bit included in a CRC codeword bit sequence concatenated to the polar codeword bit sequence after the SCL decoding operation is terminated, thereby improving error correction performance. Herein, it will be assumed that the number of parity bit(s) included in the PC codeword bit sequence is three, and the three parity bits are DF bits.

In various embodiments of the disclosure, it will be assumed that a PC code is used in describing a generating process and a decoding process for DF bits, but various embodiments of the disclosure are not limited to the PC code, and various embodiments of the disclosure may be applied to a case that various codes, such as a convolutional code, a BCH code, a distributed CRC code, and/or the like as well as the PC code are used.

Another example of an inner structure of a transmitting device in a communication system according to an embodiment of the disclosure will be described with reference to FIG. 4.

Figure 4:
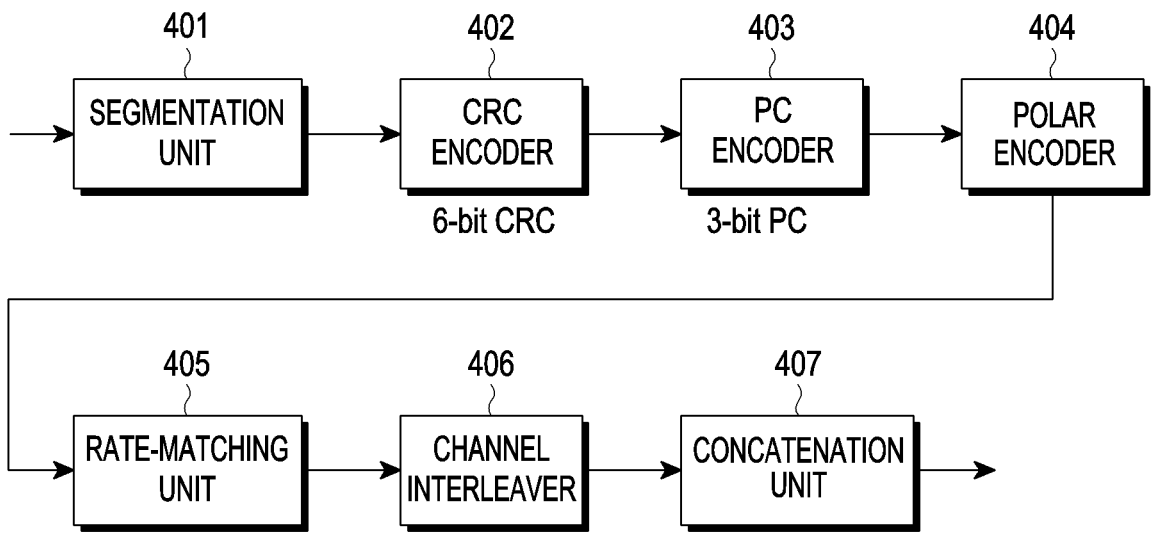
FIG. 4 schematically illustrates an inner structure of a transmitting device in a communication system according to an embodiment of the disclosure.

FIG. 4 schematically illustrates an inner structure of a transmitting device in a communication system according to an embodiment of the disclosure.

Referring to FIG. 4, the transmitting device may be one of a BS, a node B, an eNB, a gNB, and/or the like.

The transmitting device illustrated in FIG. 4 may be one of a terminal, a UE, an MS, and/or the like. Further, the transmitting device illustrated in FIG. 4 may be one of various types of electronic devices. Electronic devices according to various embodiments of the disclosure may include, for example, a computer device, a portable communication device (e.g., a smartphone), a portable multimedia device, a portable medical device, a camera, a wearable device, or a home appliance. According to various embodiments of the disclosure, the electronic devices are not limited to those described above.

Referring to FIG. 4, when an information bit sequence to be transmitted is inputted to the transmitting device, the information bit sequence is inputted to a segmentation unit 401. The segmentation unit 401 performs a segmentation operation on the information bit sequence if necessary. For example, if the information bit sequence satisfies a set criterion, the segmentation unit 401 segments the information bit sequence into s segments, for example, two segments. Here, if the information bit sequence does not satisfy the set criterion, the segmentation unit 401 does not perform the segmentation operation and outputs, as it is, the information bit sequence to a CRC encoder 402.

The set criterion may be a case that a length of the information bit sequence is longer than set length, and thus, if the information bit sequence does not satisfy the set criterion, that is, if the length of the information bit sequence is shorter than or equal to the set length, the segmentation operation is not performed on the information bit sequence, and the information bit sequence is outputted to the CRC encoder 402 as it is.

In addition, a segment may be referred to as a code block. Each code block is individually encoded, and final codeword bit sequences generated through the individual encoding are subsequently concatenated in a concatenation unit 407.

Meanwhile, a code block of a length A outputted from the segmentation unit 401 is inputted to the CRC encoder 402, and the CRC encoder 402 performs a CRC encoding operation on the code block to generate a CRC codeword bit sequence including $B_{CRC}=6$ parity bits. Here, a length of the CRC codeword bit sequence is $A+B_{CRC}$. The CRC codeword bit sequence is inputted to a PC encoder 403.

The PC encoder 403 performs a PC encoding operation on the CRC codeword bit sequence to generate a PC codeword bit sequence including $B_{PC}=3$ parity bits. Here, a length of the PC codeword bit sequence is $A+B_{CRC}+B_{PC}$.

In addition, the PC encoding operation may be performed when a sub-channel allocating operation included in a polar encoding operation performed in a polar encoder 404 is performed, or may be performed separately from the polar encoding operation. In an embodiment of the disclosure, it will be assumed that the PC encoding operation is performed separately from the polar encoding operation.

A length of the PC codeword bit sequence is $A+B_{CRC}+B_{PC}$, and the PC codeword bit sequence is an input bit sequence for the polar encoder 404. The polar encoder 404 maps the bit sequence of the length $A+B_{CRC}+B_{PC}$ to a bit sequence u of a length N. Herein, N denotes a length of a mother code used in the polar encoding scheme, and is determined based on a determined criterion.

Bits included in the bit sequence of the length $A+B_{CRC}+B_{PC}$ are mapped to bits which are transmitted through sub-channels having relatively high reliability among bits included in the bit sequence u. Herein, reliability of bit indices of the bits included in the bit sequence u is determined based on a channel capacity of a sub-channel according to channel polarization, and/or the like.

The $A+B_{CRC}+B_{PC}$ bits whose reliability is relatively high among the N bits included in the bit sequence u are selected, CRC codeword bits included in the CRC codeword bit sequence are mapped to $A+B_{CRC}$ bits among the $A+B_{PC}$ bits, and parity bits generated by a PC code are mapped to remaining $B_{PC}$ bits. Generally, the bits in the bit sequence u to which the $B_{PC}$ parity bits are mapped are determined such that bit indices thereof are distributed.

Alternatively, if the PC encoding operation is performed while the sub-channel allocating operation performed by the polar encoder 404 is performed, the parity bits generated by the PC code, i.e., the $B_{PC}$ parity bits are determined as a binary sum of CRC codeword bits which are mapped to bits whose bit indices are less than bit indices of the $B_{PC}$ parity bits in the bit sequence u and some of frozen bits. For example, the polar encoder 404 generates the $B_{PC}$ parity bits, e.g., 3 parity bits using a shift register of a length 5 while reading the bit sequence u in a bit index order.

The polar encoder 404 encodes the bit sequence u of a length N based on a polar code of a length to generate a polar codeword bit sequence, and the polar codeword bit sequence is outputted to a rate-matching unit 405. The rate-matching unit 405 performs a rate matching operation on the polar codeword bit sequence, and outputs the rate-matched bit sequence to a channel interleaver 406. Herein, the bit sequence outputted from the rate-matching unit 405 is a final codeword bit sequence.

The channel interleaver 406 performs an interleaving operation on the final codeword bit sequence outputted from the rate-matching unit 405 and then outputs the interleaved bit sequence to a concatenation unit 407. Herein, the interleaving operation is performed based on a set interleaving scheme, and the interleaving operation may not be performed if necessary. In this case, the final codeword bit sequence outputted from the rate-matching unit 405 is outputted to the concatenation unit 407 as it is.

The concatenation unit 407 concatenates final codeword bit sequences generated for code blocks to generate a transmission bit sequence. Herein, if the segmentation unit 401 outputs only one code block, there is one final codeword bit sequence on which a concatenation operation will be performed, so the concatenation unit 407 outputs the final codeword bit sequence as the transmission bit sequence.

In FIG. 4, both of a CRC code and a PC code are concatenated to a polar code, but in various embodiments of the disclosure, only one of the CRC code and the PC code may be concatenated to the polar code. For example, only the PC code may be concatenated to the polar code. In this case, it may be regarded to consider $B_{CRC}=0$ in an operation of a transmitting device according to an embodiment of the disclosure.

Meanwhile, the transmitting device illustrated in FIG. 4 may be used to transmit control information, for example, control information having a length which is greater than or equal to 12 and less than or equal to 19 in an uplink of a 3GPP NR system.

Although the segmentation unit 401, the CRC encoder 402, the PC encoder 403, the polar encoder 404, the rate-matching unit 405, the channel interleaver 406, and the concatenation unit 407 are described as separate units in FIG. 4, it is to be understood that at least two of the segmentation unit 401, the CRC encoder 402, the PC encoder 403, the polar encoder 404, the rate-matching unit 405, the channel interleaver 406, and the concatenation unit 407 may be incorporated in one unit, and the segmentation unit 401, the CRC encoder 402, the PC encoder 403, the polar encoder 404, the rate-matching unit 405, the channel interleaver 406, and the concatenation unit 407 may be implemented with at least one processor.

Another example of an inner structure of a receiving device in a communication system according to an embodiment of the disclosure will be described with reference to FIG. 5.

Figure 5:
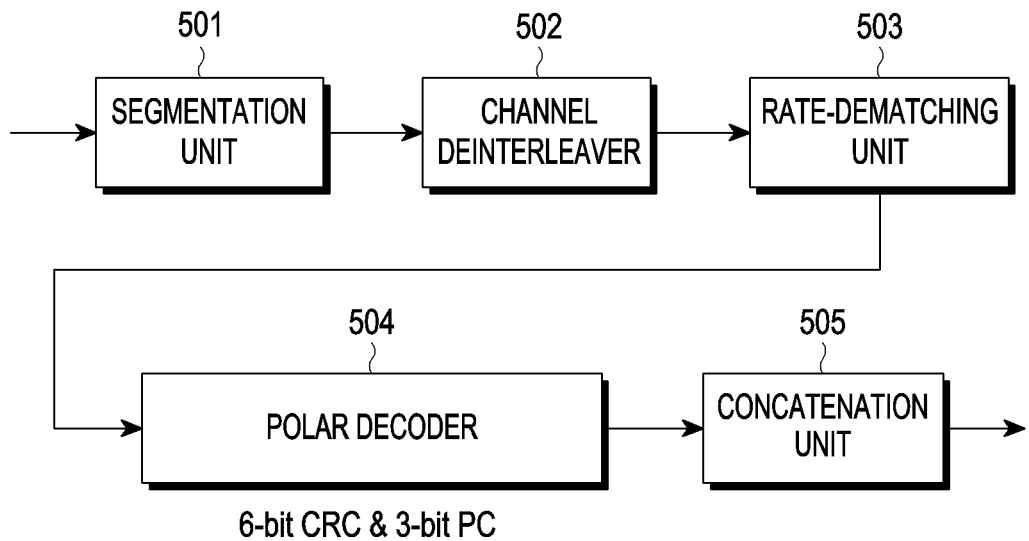
FIG. 5 schematically illustrates an inner structure of a receiving device in a communication system according to an embodiment of the disclosure.

FIG. 5 schematically illustrates an inner structure of a receiving device in a communication system according to an embodiment of the disclosure.

Prior to a description of FIG. 5, a receiving operation of a receiving device shown in FIG. 5 may correspond to a reverse process of a transmitting operation of a transmitting device described in FIG. 4.

Referring to FIG. 5, the receiving device may be one of a terminal, a UE, an MS, and/or the like. Further, the receiving device illustrated in FIG. 5 may be one of various types of electronic devices. Electronic devices according to various embodiments of the disclosure may include, for example, a computer device, a portable communication device (e.g., a smartphone), a portable multimedia device, a portable medical device, a camera, a wearable device, or a home appliance. According to various embodiments of the disclosure, the electronic devices are not limited to those described above.

The receiving device illustrated in FIG. 5 may be one of a BS, a node B, an eNB, a gNB, and/or the like.

Referring to FIG. 5, a received bit sequence received in a receiving device is inputted to a segmentation unit 501. The segmentation unit 501 performs a segmentation operation on the received bit sequence if necessary. For example, if the received bit sequence satisfies a set criterion, the segmentation unit 501 segments the received bit sequence into s bit sequences, for example, two bit sequences. Herein, if the received bit sequence does not satisfy the set criterion, the segmentation unit 501 does not perform the segmentation operation and outputs, as it is, the received bit sequence to a channel deinterleaver 502.

The set criterion may be a case that a length of the received bit sequence is longer than a set length, and thus, if the received bit sequence does not satisfy the set criterion, that is, if the length of the received bit sequence is shorter than or equal to the set length, the segmentation operation is not performed on the received bit sequence, and the received bit sequence is outputted to the channel deinterleaver 502 as it is.

The channel deinterleaver 502 performs a channel deinterleaving operation corresponding to a channel interleaving operation applied in a transmitting device which corresponds to the receiving device on the bit sequence outputted from the segmentation unit 501 to generate a channel deinterleaved bit sequence and outputs the channel deinterleaved bit sequence to a rate-dematching unit 503.

The rate-dematching unit 503 generates a rate-dematched bit sequence by performing a rate-dematching operation corresponding to a rate-matching operation applied in the transmitting device, and outputs the rate-dematched bit sequence to a polar decoder 504. Herein, the bit sequence outputted from the rate-dematching unit 503 is an LLR sequence of a length N. In FIG. 5, for example, it will be assumed that the bit sequence outputted from the rate-dematching unit 503 is the LLR sequence of a length N, however, a value calculated for the decoding operation in the polar decoder 504 does not need to be an LLR value, and may be an LR value or a probability value for each of bit values 0 and 1.

The polar decoder 504 performs a polar decoding operation which corresponds to a polar encoding operation applied in the transmitting device, i.e., an SC decoding scheme-based decoding operation on the LLR sequence of the length N. In one embodiment of the disclosure, it will be assumed that an SC decoding scheme is an SCL decoding scheme. Meanwhile, in the SCL decoding operation, a CRC code and a PC code concatenated to a polar code are used together thereby improving error correction performance, this will be described in more detail below, so a detailed description thereof will be omitted herein.

Upon completion of the polar decoding operation, the polar decoder 504 outputs an estimated information sequence to a concatenation unit 505.

The concatenation unit 505 concatenates estimated information bit sequences generated for the s bit sequences in the segmentation unit 501 which are outputted from the polar decoder 504, and outputs a sequence in which s estimated information bit sequences are concatenated as a final information sequence. As described above, the CRC code and the PC code are concatenated to the polar code to improve error correction performance of the polar code.

Meanwhile, an error detection operation for a decoding result needs to be also performed on a channel code, such as the polar code, and/or the like. In various embodiments of the disclosure, a case that a decoder determines that decoding is successful despite failure of the decoding will be referred to as false alarm or false positive. In various embodiments of the disclosure, a probability or rate at which false alarm or false positive occurs will be referred to as a false alarm rate (FAR) or a false positive rate (FPR). This FPR may seriously affect reliability and stability of a system in an aspect that a transmitting device and a receiving device perform a subsequent operation based on inaccurate information even though a decoder fails in decoding.

Accordingly, in order to improve the stability of the system, a channel code needs to have an error detection capability to perform error detection on a decoded result as well as an error correction capability to correct an occurred error.

However, unlike an LDPC code, a polar code does not have a hard decision-based error detection capability, and thus an error detection operation is performed based on an outer code, for example, a CRC code, connected to the polar code.

An important issue in using a CA-SCL decoder is that some of an error detection capability of the CRC code is used for error correction, so the error detection capability that may be obtained through the CRC code decreases. This will be described in detail as follows.

First, the error detection capability of the CA-SCL decoder may be analyzed based on the number of parity bits generated by the CRC code and a list size used in the CA-SCL decoder. Herein, it will be assumed that the number of parity bits generated by the CRC code is $B_{CRC}$ and the list size used in the CA-SCL decoder is L.

If a length of an information bit sequence encoded by the CRC code is significantly long, for example, if the length of the information bit sequence encoded by the CRC code is longer than or equal to a threshold length, a probability that a randomly generated information bit sequence passes through a CRC check may be approximated to $2^{-B_{CRC}}$.

Herein, if the number of randomly generated information bit sequences for which a CRC check is performed is L, a probability P that at least one of the L information bit sequences passes through the CRC check may be expressed as Equation 3.

$$P=1-(1-2^{-B_{CRC}})^L \quad \text{Equation 3}$$

It will be assumed that SCL decoding fails, and thus all lists obtained after an SCL decoding operation is completed are different from a transmission bit sequence transmitted by a transmitting device. As described above, an SC scheme-based decoding scheme is a scheme of sequentially decoding bits included in an information bit sequence according to a bit index. Therefore, if an error occurs in a decoding result for a specific bit while the SCL decoding operation is performed, reliability of decoding for bits after the specific bit is almost 0, so the decoding result according to the SCL decoding operation may be regarded as a random bit sequence. This phenomenon is an error-propagation phenomenon.

Accordingly, if the SCL decoding fails, lists obtained as the SCL decoding operation is completed are almost randomly generated bit sequences. Therefore, a probability of erroneously determining that decoding is successful even though a decoder fails in decoding, i.e., an FPR is equal to a probability $1-(1-2^{-B_{CRC}})^L$ that at least one of L random sequences will pass through a CRC check.

As expressed in Equation 3, it may be understood that the smaller $B_{CRC}$ is and the larger L is, the more increased an FPR is and the more decreased error detection performance is. For example, assuming that a size of a CRC code, i.e., the number of parity bits generated by the CRC code is $B_{CRC}=6$, and a list size used in a CA-SCL decoder is L in a communication system, an approximate FPR is detected as shown in Table 1 according to the list size L used in the CA-SCL decoder.

The approximate FPR of Table 1 does not consider a characteristic of the CRC code, so an accurate FPR may be changed based on a characteristic of the CRC code, configuration of a polar code, a channel, and/or the like.

TABLE 1

| List size (L) | Approximate FPR |
|---|---|
| 1 | 1.56% |
| 2 | 3.10% |
| 4 | 6.11% |
| 8 | 11.84% |
| 16 | 22.27% |
| 32 | 39.59% |
| 64 | 63.50% |
| 128 | 86.68% |

As shown in Table 1, if the CA-SCL decoder is used, it may be understood that error detection performance decreases if a list size L is increased to increase error correction performance. This is a characteristic of a linear code, such as the polar code, and this characteristic occurs because there is a trade-off between error correction performance and error detection performance that the linear code may achieve.

Accordingly, if the polar decoder uses the SCL decoding scheme, the trade-off between the error correction performance and the error detection performance may be controlled by adjusting the list size L.

However, if a length of a CRC code used in a communication system is not long enough, for example, if the length of the CRC code is shorter than a threshold length, a case that it is difficult to satisfy an error detection performance requirement which the communication system intends to achieve may occur. For example, assuming that an FPR required by the communication system is less than or equal to 1%, the communication system does not satisfy the error detection performance requirement due to limitation according to the length of the CRC code.

One of schemes for addressing the above issue, i.e., an issue that sufficient error detection performance, e.g., error detection performance which is greater than threshold error detection performance is not achieved because the list size L is large, for example, the list size L is longer than a threshold size and the length $B_{CRC}$ of the CRC code is short, for example, the length $B_{CRC}$ of the CRC code is shorter than a threshold length in the communication system using the CA-SCL decoding scheme is to perform a CRC check on only some of lists, e.g., a set number of lists, e.g., $L_t$ lists among the L lists after the CA-SCL decoding operation. A CRC check needs to be performed on at least one list, so relation $1 \leq L_t \leq L$ needs to be satisfied for $L_t$ and $L_t$. For convenience of implementation, there may be a restriction that a value of $L_t$ needs to be a power of 2, but it will be noted that the value of $L_t$ is not limited to only a power of 2.

Meanwhile, for achieving excellent performance, for example, error detection performance which is greater than threshold error detection performance, $L_t$ lists for which a CRC check will be performed need to be selected from a list with the highest probability among total L lists in ascending order of probability. Here, the lists may be determined based on a PM which is based on probability information obtained in CA-SCL decoding. Lists, i.e., lists, for which the CRC check will not be performed among the lists are not considered as decoding targets and then discarded.

In this way, if the CRC check is performed only on the $L_t$ lists not all lists, an approximate FPR may be expressed as Equation 4.

$$\text{Approximate } FPR = 1-(1-2^{-B_{CRC}})^{L_t} \quad \text{Equation 4}$$

An FPR in a case that Equation 3, Equation 4, and the relation $L_t \leq L$ are considered becomes lower than an FPR obtained in a case that the CRC check is performed on all of the L lists.

However, in this case, a list corresponding to an information bit sequence transmitted in a transmitting device may exist among lists for which the CRC check is not performed and then discarded, so error correction performance may decrease.

Error correction performance of an SCL decoder in a communication system according to an embodiment of the disclosure will be described with reference to FIG. 6.

Figure 6:
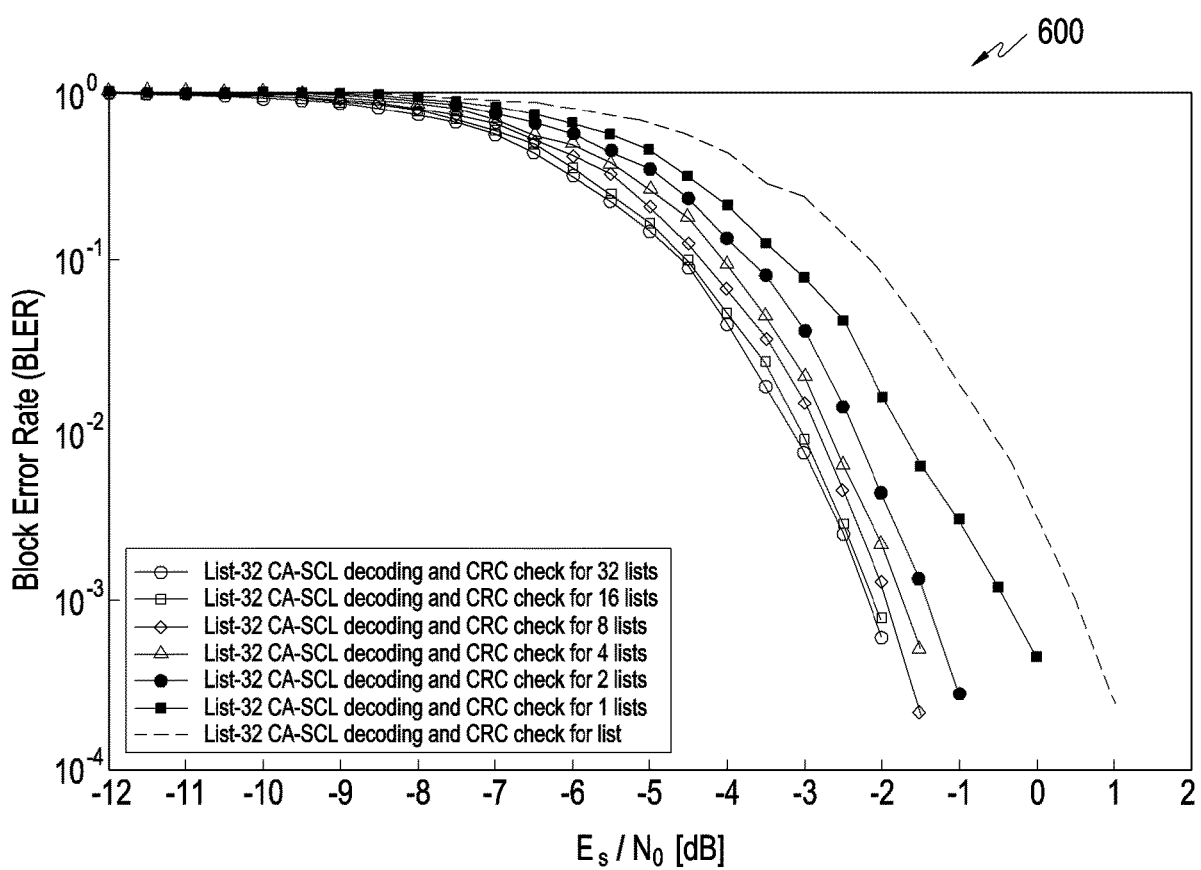
FIG. 6 schematically illustrates error correction performance of an SCL decoder in a communication system according to an embodiment of the disclosure.

FIG. 6 schematically illustrates error correction performance of an SCL decoder in a communication system according to an embodiment of the disclosure.

Referring to FIG. 6, a graph illustrated in FIG. 6 is a block error rate (BLER) graph showing error correction performance according to the number of lists for which a CRC check is performed when a (120, 18) polar code to which a 6 bit-CRC code and a 3-bit PC code are concatenated is decoded using an SCL decoder with a list size 32. For example, the graph illustrated in FIG. 6 is a graph showing error correction performance according to the number of lists for which the CRC check is performed when the number of information bits included in an information bit sequence is 18 (A=18), a length of a CRC code is 6 ($B_{CRC}=6$), a length of a final codeword bit sequence, i.e., a length of a transmission bit sequence is 120 (E=120), and an SCL decoder with a list size 32 (L=32) is used.

In the first simulation, a CA-SCL decoder with L=32 is used, and a CRC check is performed on all of L=32 lists obtained after a CA-SCL decoding operation is terminated. In this case, an FPR is $1-(1-2^{-6})^{32}=39.59\%$, and a BLER in this case is marked as "List-32 CA-SCL decoding and CRC check for 32 lists" in FIG. 6.

In the second simulation, the CA-SCL decoder with L=32 is used, but the CRC check is performed on $L_t$ lists including a list whose probability is determined to be the highest based on a PM among the L=32 lists obtained after the CA-SCL decoding operation is terminated in ascending order of probability, and remaining $L-L_t$ lists are discarded. In this case, an FPR is significantly improved to $1-(1-2^{-6})^{L_t}$.

Herein, a BLER in a case that the $L_t$ is 16 is marked as "List-32 CA-SCL decoding and CRC check for 16 lists" in FIG. 6, a BLER in a case that the Lt is 8 is marked as "List-32 CA-SCL decoding and CRC check for 8 lists" in FIG. 6, a BLER in a case that the Lt is 4 is marked as "List-32 CA-SCL decoding and CRC check for 4 lists" in FIG. 6, and a BLER in a case that the Lt is 2 is marked as "List-32 CA-SCL decoding and CRC check for 2 lists" in FIG. 6.

More particularly, if the CRC check is performed only on a list whose probability is determined to be the highest based on the PM among the L=32 lists, and remaining 31 lists are discarded, an FPR is significantly improved to $1-(1-2^{-6})^1=1.56\%$, and a BLER in this case is marked as "List-32 CA-SCL decoding and CRC check for 1 list" in FIG. 6.

Finally, in the third simulation, an SC decoder whose a list size L is 1 (L=1) is used, and the CRC check is performed on one list which is obtained after the SC decoding operation is terminated. In this case, an FPR is $1-(1-2^{-6})^1=1.56\%$, and a BLER in this case is marked as "List-1 SC decoding and CRC check for 1 list" in FIG. 6.

Meanwhile, it will be noted that FIG. 6 shows error correction performance of the SCL decoder by a BLER which is a ratio of blocks on which an error occurs if blocks transmitted through an additive white Gaussian noise (AWGN) channel are decoded using a decoder.

The more excellent error correction performance of the decoder is, the more left a location of a BLER curve is on the graph. As shown in the simulation, even though the CA-SCL decoder with the list size L=32 is used, if the CRC check is performed only on some of obtained lists, error correction performance deteriorates.

Because the CA-SCL decoder with the list size L=32 is used, even though a list size $L_t$ for which the CRC check is performed is 1 ($L_t=1$), it will be understood that error correction performance thereof is better compared to a case that an SC decoder for which a list size is 1 (L=1) is used. For example, even though the same FPR is obtained, it may be understood that it is more advantageous in terms of error correction performance that a CA-SCL decoder whose L is large and a list size $L_t$ for which the CRC check is performed is limited.

However, the most important point that may be identified in FIG. 6 is that performance of the CA-SCL decoder is significantly affected not only by the list size L, but also by the list size $L_t$ for which the CRC check is performed.

Meanwhile, various embodiments of the disclosure propose a polar decoding scheme to perform an error detection operation using a DF bit(s) as well as a CRC code, and this will be described below.

A polar decoding scheme proposed in various embodiments of the disclosure improves error detection performance using some or all of at least one DF bit included in a polar codeword bit sequence for error detection, and obtain error correction performance of a level required in a communication system by adjusting a list size $L_t$ for which a CRC check is performed among lists obtained according to completion of a CA-SCL decoding operation. In various embodiments of the disclosure, it will be assumed that the DF bit is a parity bit of a PC code concatenated to the polar code.

If it is assumed that the number of parity bits generated by a PC code is $B_{PC}$, $B_{PC}^{ED}(0 \leq B_{PC}^{ED} \leq B_{PC})$ parity bits which may be some or all of the $B_{PC}$ parity bits are used for error detection, and remaining $B_{PC}^{EC}(0 \leq B_{PC}^{EC} \leq B_{PC})$ parity bits are used for error correction. For example, a sum of the number of parity bits used for the error detection and the number of parity bits used for the error correction is equal to the number $B_{PC}$ of parity bits generated by the PC code ($B_{PC}^{ED}+B_{PC}^{EC}=B_{PC}$).

A scheme in which the SCL decoder uses the parity bits generated by the PC code for the error correction has been described above, so a detailed description thereof will be omitted herein, and a scheme in which the SCL decoder uses the parity bits generated by the PC code for error detection will be described below, so a detailed description will be omitted herein.

In various embodiments of the disclosure, the number $B_{PC}^{ED}$ of parity bits to be used for error detection among parity bits generated by the PC code is determined according to a requirement for error detection performance given in a communication system. Herein, the number $B_{PC}^{ED}$ of parity bits to be used for the error detection is greater than or equal to 0 and less than or equal to a total number $B_{PC}$ of the parity bits generated by the PC code ($0 \leq B_{PC}^{ED} \leq B_{PC}$).

When the number $B_{PC}^{ED}$ of parity bits to be used for the error detection is determined, the number $B_{PC}^{EC}$ of parity bits to be used for error correction during an SCL decoding operation is determined as $B_{PC} - B_{PC}^{ED}$ ($B_{PC}^{EC} = B_{PC} - B_{PC}^{ED}$).

According to various embodiments of the disclosure, $B_{PC}^{EC}$ may be first determined according to a requirement for error correction performance given in the communication system, and $B_{PC}^{ED}$ may be determined as $B_{PC}^{ED} = B_{PC} - B_{PC}^{EC}$ based on the determined $B_{PC}^{EC}$.

According to various embodiments of the disclosure, $B_{PC}^{ED}$ and $B_{PC}^{EC}$ may be determined under a criterion that relation of $B_{PC}^{ED} + B_{PC}^{EC} = B_{PC}$ is satisfied according to the requirement for the error detection performance and the requirement for the error correction performance which are given in the communication system.

As described above, when the number $B_{PC}^{ED}$ of parity bits to be used for the error detection and the number $B_{PC}^{EC}$ of parity bits to be used for the error correction among the parity bits generated by the PC code are determined, it is determined which bits among the parity bits generated by the PC code which are mapped to a bit sequence u will be used for the error detection and which bits among the parity bits generated by the PC code that are mapped to the bit sequence u will be used for the error correction.

In various embodiments of the disclosure, parity bits to be used for error detection and parity bits to be used for error correction are determined based on bit indices of bits to which the parity bits generated by the PC code among bits included in the bit sequence u are mapped, and this will be described in detail as follows.

First, it will be assumed that a set of bit indices of bits included in a bit sequence u of a length N is $Z_N = \{0, 1, \ldots, N-1\}$. Herein, it will be noted that the indices of the bits included in the bit sequence u start from, for example, 0.

In addition, it will be assumed that a set of bit indices of bits to which $B_{PC}$ parity bits generated by a PC code among bits included in the bit sequence u are mapped is $Q_N^{PC}$, and the set $Q_N^{PC}$ is a subset of the set $Z_N$ ($Q_N^{PC} \subset Z_N$). Herein, a size of the set $Q_N^{PC}$ is $|Q_N^{PC}| = B_{PC}$.

Further, $B_{PC}^{EC}$ parity bits among the $B_{PC}$ parity bits are used for error correction, and remaining $B_{PC}^{ED}$ parity bits are used for error detection. It will be assumed that a set of bit indices of bits to which the $B_{PC}^{EC}$ parity bits used for the error correction among the bits included in the bit sequence u are mapped is $Q_N^{PC,EC}$, and a set of bit indices of bits to which the $B_{PC}^{ED}$ parity bits used for the error detection are mapped is $Q_N^{PC,ED}$. Herein, a size of the set $Q_N^{PC,EC}$ is $|Q_N^{PC,EC}| = B_{PC}^{EC}$, and a size of the set $B_{PC}^{ED}$ is $|Q_N^{PC,ED}| = B_{PC}^{ED}$.

In various embodiments of the disclosure, the parity bits to be used for error correction and the parity bits to be used for error detection among the $B_{PC}$ parity bits may be determined by considering synthetic channel indices or reliability information of synthetic channels to which the $B_{PC}$ parity bits among the bits included in the bit sequence u are mapped. Herein, the reliability information may be, for example, reliability designated by a predetermined sequence, or reliability, such as a channel capacity calculated by an equation or a calculation program, and/or the like.

According to various embodiments of the disclosure, $B_{PC}^{EC}$ an parity bits which correspond to synthetic channels whose reliability is low, for example, synthetic channels whose reliability is lower than threshold reliability among $B_{PC}$ parity bits generated by a PC code are used for error correction. Alternatively, $B_{PC}^{ED}$ parity bits which correspond to synthetic channels whose reliability is high, for example, synthetic channels whose reliability is higher than or equal to the threshold reliability among the $B_{PC}$ parity bits are used for error detection.

In various embodiments of the disclosure, for example, it will be assumed that $B_{PC} = 3$ parity bits are mapped to bits which correspond to bit indices belonging to a set $Q_N^{PC} = \{q_{PC}^1, q_{PC}^2, q_{PC}^3\}$ among bits included in a bit sequence u.

In addition, it will be assumed that reliability of a synthetic channel corresponding to the $i^{th}$ bit among the bits included in the bit sequence u is R(i). Herein, reliability of an arbitrary synthetic channel may be determined based on a set sequence as in, for example, a 3PP NR system, or may be calculated based on an equation or a calculation program. In various embodiments of the disclosure, it will be assumed that a scheme of determining or calculating the reliability of the arbitrary synthetic channel is not limited. For example, it will be noted that various embodiments of the disclosure are not limited to the scheme of determining or calculating the reliability of the arbitrary synthetic channel.

Meanwhile, it will be assumed that relation among reliability of synthetic channels which correspond to the bits to which the $B_{PC} = 3$ parity bits are mapped is given as $R(q_{PC}^1) < R(q_{PC}^2) < R(q_{PC}^3)$. In this case, the parity bits mapped to the $B_{PC}^{EC}$ synthetic channels whose reliability is low, i.e., the $B_{PC}^{EC}$ parity bits are used for the error correction, and the parity bits mapped to the $B_{PC}^{ED}$ synthetic channels whose reliability is high, i.e., the $B_{PC}^{ED}$ parity bits are used for the error detection. For example, if $B_{PC}^{EC}$ 1 ($B_{PC}^{EC} = 1$) and $B_{PC}^{ED}$ is 2 ($B_{PC}^{ED} = 2$), it is determined as $Q_N^{PC,EC} = \{q_{PC}^1\}$ and $Q_N^{PC,ED} = \{q_{PC}^2, q_{PC}^3\}$ according to the rule as described above.

As another example, if $B_{PC}^{EC}$ is 2 ($B_{PC}^{EC} = 2$) and $B_{PC}^{ED}$ is 1 ($B_{PC}^{ED} = 1$), it is determined as $Q_N^{PC,EC} = \{q_{PC}^1, q_{PC}^2\}$ and $Q_N^{PC,ED} = \{q_{PC}^3\}$ according to the rule as described above.

As described above, a reason why a PC code-parity bit mapped to a low-reliability synthetic channel is used for error correction is that it is advantageous to perform error correction on uncertain bits to improve error correction performance, and this will be described below. Herein, a PC code-parity bit represents a parity bit generated by a PC code.

First, a probability that a decoding result after polar decoding a PC code-parity bit mapped to a high-reliability synthetic channel is "true" is relatively high. Accordingly, if an error correction operation is performed on a bit for which a probability that a decoding result for the bit is true is relatively high, it may be difficult to significantly improve error correction performance.

Alternatively, a probability that a decoding result after polar decoding a PC code-parity bit mapped to a low-reliability synthetic channel is "true" is relatively low. Accordingly, if an error correction operation is performed on a bit for which a probability that a decoding result for the bit is true is relatively low, it may be possible to expect significant improvement in error correction performance compared to a case that the error correction operation is performed on the bit for which the probability that the decoding result for the bit is true is relatively high.

Generally, a low-reliability synthetic channel corresponds to bits which are decoded first because bit indices thereof are small among bits included in a bit sequence u. Therefore, an error-propagation phenomenon which may occur in an SC decoding operation may be prevented by performing an error correction operation on bits which are first decoded in order to cancel a list for which an error occurs, so error correction performance may be additionally improved.

As described above, a fact that a controller uses reliability when determining PC bits to be used for error correction and PC bits to be used for error detection may increase complexity of an entire system. For example, in order for the controller to determine the PC bits to be used for the error correction and the PC bits to be used for the error detection, there may be a need for not only an operation of calculating reliability of a synthetic channel which corresponds to each of the bits included in the bit sequence u using a relatively complex equation, but also an operation of using a memory for keeping tracking and using reliability of each synthetic channel. Accordingly, a fact that the controller uses the reliability upon determining the PC bits to be used for the error correction and the PC bits to be used for the error detection may increase the complexity of the entire system.

Accordingly, various embodiments of the disclosure propose a PC bit-determining scheme for determining PC bits to be used for error correction and PC bits to be used for error detection while having a relatively low complexity and simple implementation.

The PC bit-determining scheme is based on a characteristic that the larger bit indices of bits are, the higher reliability of synthetic channels for the bits included in a bit sequence u is, and a characteristic that the smaller the bit indices of the bits are, the lower the reliability of the synthetic channels for the bits included in the bit sequence u is.

In addition, it will be noted that a bit index of a bit mapped to a synthetic channel is not used to determine reliability of the synthetic channel in the PC bit-determining scheme. However, there is a characteristic that a probability that reliability of the synthetic channel is high is high if the bit index of the bit mapped to the synthetic channel is large.

Based on this characteristic, in the PC bit-determining scheme, ac PC bits which include a bit with a minimum bit index in ascending order of bit index among the bits included in the input bit sequence u among $B_{PC}$ PC bits are used for error correction. In the PC bit-determining scheme, $B_{PC}^{ED}$ PC bits which include a bit with a maximum bit index in descending order of bit index among the bits included in the input bit sequence u among the $B_{PC}$ PC bits are used for error detection. For example, in the PC bit-determining scheme, the $B_{PC}^{EC}$ PC bits starting from the bit with the minimum bit index in ascending order of bit index among the bits included in the input bit sequence u among the $B_{PC}$ PC bits are used for the error correction. In addition, the $B_{PC}^{ED}$ PC bits starting from the bit with the maximum bit index detection in descending order of bit index among the bits included in the input bit sequence u among the $B_{PC}$ PC bits are used for the error.

For example, it will be assumed that PC bits of a length 3, i.e., $B_{PC}=3$ PC bits are mapped to bits having bit indices belonging to a set $Q_N^{PC}=\{q_{PC}^1, q_{PC}^2, q_{PC}^3\}$ among the bits included in the bit sequence u. Herein, elements of the set $Q_N^{PC}$ satisfy relation of $q_{PC}^1 < q_{PC}^2 < q_{PC}^3$.

In this case, PC bits corresponding to $B_{PC}^{EC}$ bit indices which include a minimum bit index in ascending order of bit index among the bit indices included in the set $Q_N^{PC}$ are used for error correction, and PC bits corresponding to remaining $B_{PC}^{ED}$ bit indices among the bit indices included in the set $Q_N^{PC}$ are used for error detection.

For example, if $B_{PC}^{EC}$ is 1 ($B_{PC}^{EC}=1$) and $B_{PC}^{ED}$ is 2 ($B_{PC}^{ED}=2$), it is determined as $Q_N^{PC,EC}=\{q_{PC}^1\}$ and $Q_N^{PC,ED}=\{q_{PC}^2, q_{PC}^3\}$ according to the PC bit-determining scheme. As another example, if $B_{PC}^{EC}$ is 2 ($B_{PC}^{EC}=2$) and $B_{PC}^{ED}$ is 1 ($B_{PC}^{ED}=1$), it is determined as $Q_N^{PC,EC}=\{q_{PC}^1, q_{PC}^2\}$ and $Q_N^{PC,ED}=\{q_{PC}^3\}$ according to the PC bit-determining scheme.

In various embodiments of the disclosure, the number $B_{PC}^{ED}$ of PC bits to be used for error detection and the number $B_{PC}^{EC}$ of PC bits to be used for error correction among $B_{PC}$ parity bits, a set $Q_N^{PC,EC}$ of bit indices for bits to which the $B_{PC}^{ED}$ PC bits are mapped among bits included in a bit sequence u, and a set $Q_N^{PC,ED}$ of bit indices for bits to which the $B_{PC}^{EC}$ PC bits are mapped among the bits included in the bit sequence u are reflected when a polar decoding operation is performed, that is, when an SCL decoding operation is performed.

In various embodiments of the disclosure, $B_{PC}^{ED}, B_{PC}^{EC}, Q_N^{PC,EC}$, and $Q_N^{PC,ED}$ are determined by a polar decoder, or determined by a controller which exists outside the polar decoder, or preset in the polar decoder, or read by the polar decoder from a storage medium, for example, a memory.

In various embodiments of the disclosure, $B_{PC}^{ED}, B_{PC}^{EC}, Q_N^{PC,EC}$, and $Q_N^{PC,ED}$ are determined in real time according to a system situation whenever a bit sequence which needs to be decoded is inputted to the polar decoder or when an event that there is a need for changing $B_{PC}^{ED}, B_{PC}^{EC}, Q_N^{PC,ED}$ occurs, or $B_{PC}^{ED}, B_{PC}^{EC}, Q_N^{PC,EC}$, and $Q_N^{PC,ED}$ are determined as received $B_{PC}^{ED}, B_{PC}^{EC}, Q_N^{PC,ED}$, and $Q_N^{PC,ED}$ when the received $B_{PC}^{ED}, B_{PC}^{EC}, Q_N^{PC,ED}$ and $Q_N^{PC,ED}$ are received from a transmitting device which corresponds to a receiving device including the polar decoder.

Another example of a polar decoding process in a communication system according to an embodiment of the disclosure will be described with reference to FIG. 7A.

Figure 7A:
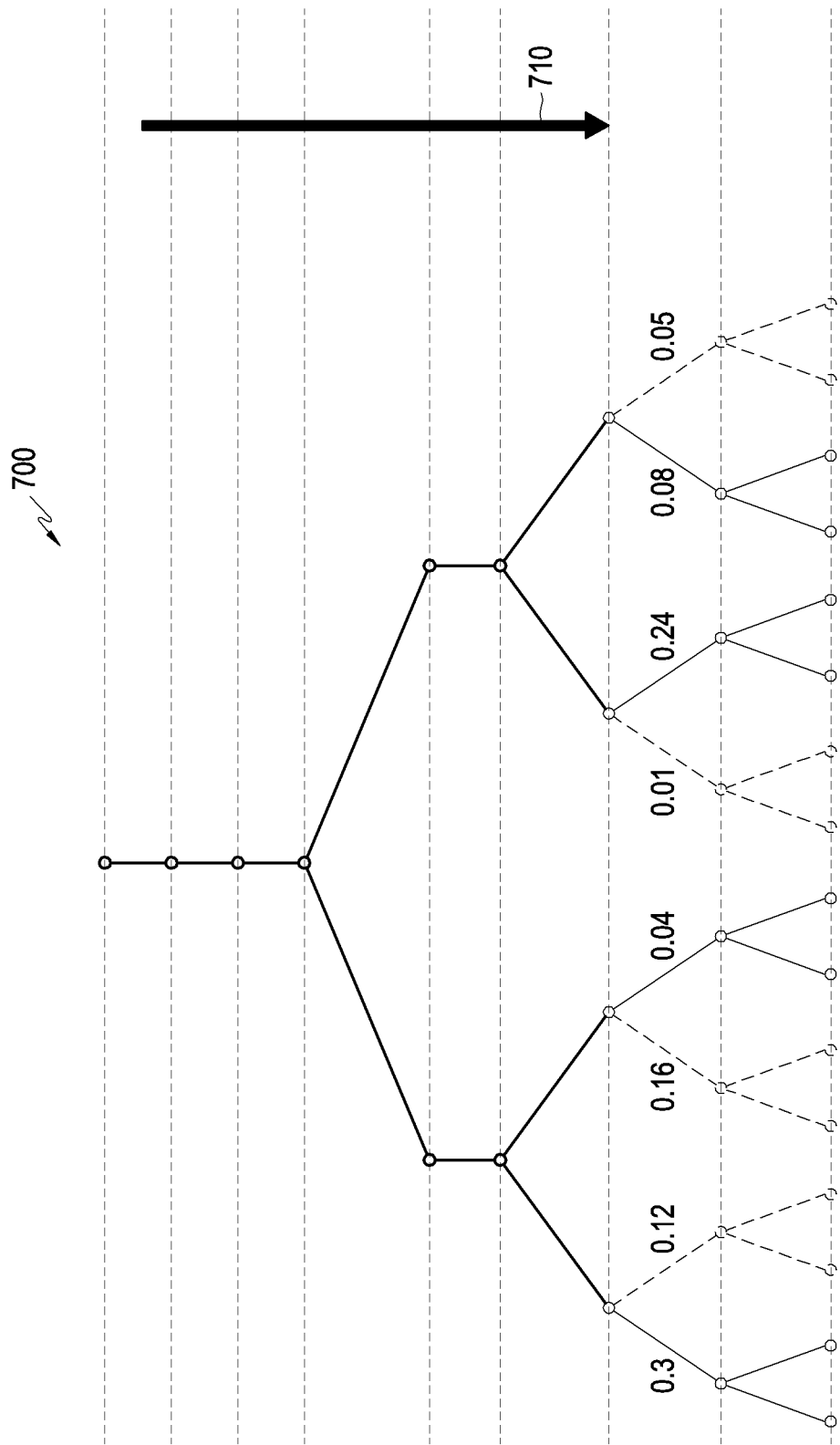
FIG. 7A schematically illustrates a polar decoding process in a communication system according to an embodiment of the disclosure.

FIG. 7A schematically illustrates a polar decoding process in a communication system according to an embodiment of the disclosure.

Referring to FIG. 7A, it will be noted that a polar decoding process 700 illustrated in FIG. 7A is a process of decoding a PC bit $u_6$ in an SCL decoding process as described in FIG. 3B.

In FIG. 7A, it will be assumed that the polar decoding process 700 is a PC code-aided SCL (PA-SCL) process in which a list size L is 4 (L=4), and which is aided by a PC bit.

In FIG. 7A, numerals marked in eight paths for the PC bit $u_6$ represent a probability of each list calculated through an SCL decoding operation (710). The probability of each list as shown in FIG. 7A may be recorded and stored in a form of another metric, such as a PM, and the like.

Meanwhile, decoding for the PC bit $u_6$ may be performed in a manner of performing an error correction operation for each list, or may be performed in a manner of performing an error detection operation for each list. Herein, it will be noted that the error correction operation and the error detection operation are mutually exclusive, so the error correction operation and the error detection operation may not be performed simultaneously. For example, it will be noted that a PA-SCL decoder based on the PA-SCL scheme does not simultaneously perform an error correction operation and an error detection operation using a PC bit.

Still another example of a polar decoding process in a communication system according to an embodiment of the disclosure will be described with reference to FIG. 7B.

Figure 7B:
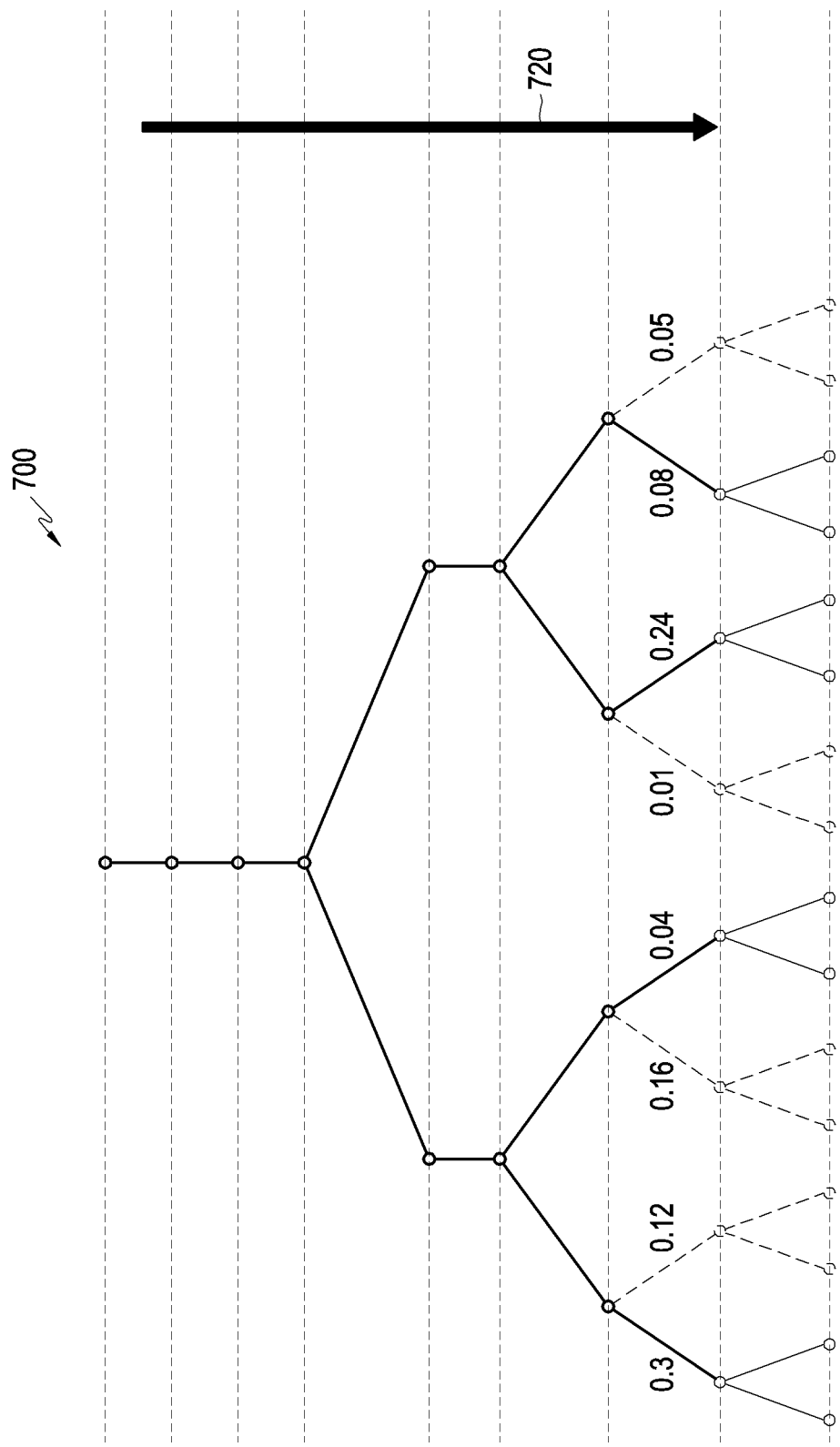
FIG. 7B schematically illustrates a polar decoding process in a communication system according to an embodiment of the disclosure.

FIG. 7B schematically illustrates a polar decoding process in a communication system according to an embodiment of the disclosure.

Referring to FIG. 7B, as described in FIG. 7A, in a polar decoding process which is based on a PA-SCL scheme, an error correction operation and an error detection operation may not be simultaneously performed using a PC bit, so a scheme in which an error correction operation is performed using a PC bit will be described in FIG. 7B.

As described in FIG. 3B, if a PC parity bit is used for error correction, a list to be decoded is determined based on a parity bit-generation equation of a PC code regardless of a probability calculated for each list. FIG. 7B shows a result in a case that 4 lists for a PC bit $u_6$ are determined based on a parity bit-generation equation of a PC code as described in FIG. 3B (720).

Still another example of a polar decoding process in a communication system according to an embodiment of the disclosure will be described with reference to FIG. 7C.

Figure 7C:
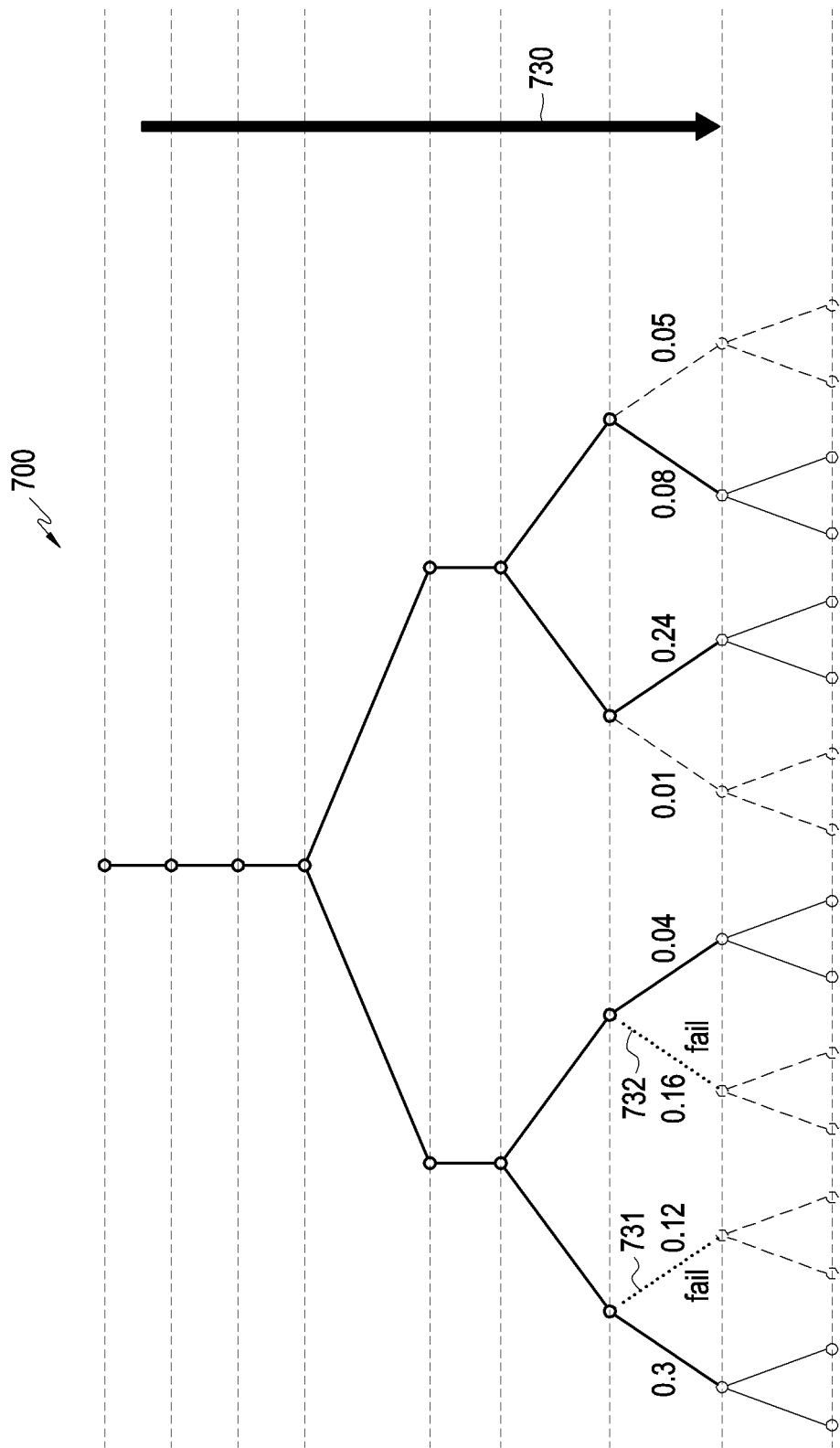
FIG. 7C schematically illustrates a polar decoding process in a communication system according to an embodiment of the disclosure.

FIG. 7C schematically illustrates a polar decoding process in a communication system according to an embodiment of the t disclosure.

Referring to FIG. 7C, as described in FIG. 7A, in a polar decoding process which is based on a PA-SCL scheme, an error correction operation and an error detection operation may not be simultaneously performed using a PC bit, so a scheme in which an error detection operation is performed using a PC bit will be described in FIG. 7C.

In the polar decoding process based on the PA-SCL scheme, if an error detection operation is performed using a PC bit, a list to be decoded is determined based on a probability calculated through an SCL decoding operation until a corresponding time point. FIG. 7C shows a result in a case that 4 lists for a PC bit $u_6$ are determined based on a probability in a situation given as described in FIG. 7A (730).

Like this, lists which do not satisfy a parity bit-generation equation of a PC code among lists which are selected based on a probability are not valid, so information indicating that corresponding lists are not valid is marked or recorded in the lists determined to be invalid (731 and 732). Herein, a memory with a relatively small capacity, a tag, a flag, a register, and the like, may be used to mark or record validity information in terms of the PC code for each list.

Like this, validity information indicating whether the parity bit-generation equation of the PC code is satisfied is recorded in each list, and a decoding operation for the next bits is performed as in a general SCL decoding scheme. Herein, if the number of at least one parity bit generated by the PC code, i.e., the number of at least one PC bit is greater than or equal to 2, an arbitrary list is determined to be invalid even though the parity bit-generation equation is not satisfied for only one of the two or more PC bits in the arbitrary list. When the SCL decoding operation is completed through this operation, a polar decoder checks whether the parity bit-generation equation for the PC bit is satisfied for each list. If there is a list which does not satisfy the parity bit-generation equation for the PC bit, the polar decoder discards the corresponding list. For example, in the error detection operation using the PC bit, a list is selected based on a probability as in a general SCL decoding process, and the corresponding list is not discarded while a decoding operation is performed even though the selected list does not satisfy the parity bit-generation equation of the PC code.

However, a list which is not valid in terms of the parity bit-generation equation of the PC code among lists which are finally detected is discarded after the decoding operation is terminated.

Meanwhile, if a CRC code is used together with the PC code, and a parity bit-generation equation of one of the PC code and the CRC code is not satisfied, a corresponding list is determined to be invalid, that is, it is determined that an error exists in the corresponding list.

Upon determining that an error exists in all lists detected by the polar decoder, the polar decoder determines decoding failure and reports the decoding failure if necessary.

As described above, in various embodiments of the disclosure, some or all of PC bits are used for error detection, so error detection performance according to polar decoding is improved.

In various embodiments of the disclosure, in order to implement a system which uses a PC bit for error detection as described above, a memory, a flag, a tag, a register, and/or the like indicating validity information of each list for each list in an SCL decoding process are required. The validity information indicates, for example, whether a corresponding list is valid or invalid, so the validity information may be implemented with binary information, and thus may be implemented with 1 bit.

As described above, if a PC bit is used for error detection, a decoding operation may be terminated early. This will be described in detail as follows.

If the PC bit is used for the error detection, when it is detected that all lists are invalid while an SCL decoding operation is performed, the polar decoder may no longer perform the decoding operation and may determine and report decoding failure.

Like this, if the decoder determines and reports the decoding failure when it is detected that all lists are invalid while the SCL decoding operation is performed, decoding which will be finally failed is terminated early, so waste of power and time due to operation required on decoding may be prevented.

Meanwhile, various embodiments of the disclosure propose a scheme of adjusting the number $B_{PC}^{ED}$ of PC bits used for error detection and the number of lists, i.e., a list size $L_t$, for which a CRC check operation is performed after completion of an SCL decoding operation in order to satisfy an error detection requirement required in a communication system. This will be described in detail as follows.

First, for satisfying the error detection requirement required in the communication system, the number $B_{PC}^{ED}$ of PC bits to be used for the error detection is set to a maximum value at a level capable of satisfying the error detection requirement, and the number of lists for which a CRC check operation will be performed, i.e., the list size $L_t$ is determined corresponding to the set number $B_{PC}^{ED}$ of PC bits.

For example, a case that a polar codeword bit sequence that the number of concatenated CRC bits is $B_{CRC}$ and the number of concatenated PC bits is $B_{PC}$ is decoded using a CA-SCL decoder with a list size L will be considered. Herein, a CRC bit represents a parity bit generated by a CRC code. In addition, it will be assumed that the number of lists for which a CRC check is performed after completion of the SCL decoding operation is $L_t$ ($1 \leq L_t \leq L$).

As proposed in various embodiments of the disclosure, in the SCL decoding operation, if the $B_{PC}^{ED}$ PC bits among the PC bits are used for the error detection and the $B_{PC}^{EC}$ PC bits among the $B_{PC}$ PC bits are used for the error correction, an achieved approximate FPR may be expressed as Equation 5.

$$\text{Approximate } FPR = 1 - (1 - 2^{-(E_{CRC} + B_{PC}^{ED})})^{L_t} \qquad \text{Equation 5}$$

Meanwhile, approximation to Equation 5 may be considered.

If $B_{CRC}+B_{PC}^{ED}$ is greater than or equal to a predetermined value in Equation 5, for example, if $B_{CRC}+B_{PC}^{ED}$ is greater than or equal to a first threshold value, and a value of $2^{-(B_{CRC}+B_{PC}ED)}$ is sufficiently small, for example, the value of $2^{-(B_{CRC}+B_{PC}ED)}$ is less than a second threshold value, Equation 5 may be approximated as Equation 6 using binomial approximation. Herein, the first threshold value and the second threshold value may be determined adaptively according to a situation of a communication system.

$$\text{Approximate } FPR = 2^{-(B_{CRC}+B_{PC}ED)+\log_2 L_t} \quad \text{Equation 6}$$

For example, in the 3GPP NR communication system as described above, $B_{CRC}$ and $B_{PC}^{ED}$ are set as $B_{CRC}=6$ and $0 \leq B_{PC}^{ED} \leq 3$, so a value of $B_{CRC}+B_{PC}^{ED}$ is relatively large, and then Equation 5 may be approximated using Equation 6.

In Equation 6, $B_{CRC}$ is the number of concatenated CRC bits and may not be adjusted. Alternatively, $B_{PC}^{ED}$ and $L_t$ are values which may be set by an SCL decoder within a range which satisfies a condition of $0 \leq B_{PC}^{ED} \leq B_{PC}$ and $1 \leq L_t \leq L$.

Assuming that a requirement for an FPR which the communication system intends to achieve is $FPR_{req}$, $B_{PC}^{ED}$ and $L_t$ are determined to satisfy a criterion expressed as Equation 7.

$$2^{-(B_{CRC}+B_{PC}ED)+\log_2 L_t} \leq FPR_{req}$$

$$-(B_{CRC}+B_{PC}^{ED})+\log_2 L_t \leq \log_2 FPR_{req} \quad \text{Equation 7}$$

In Equation 7, it will be assumed that $\log_2 FPR_{req} = -B_{req}$. Herein, $B_{req}$ is a value expressing the requirement of the FPR in bits, and if the communication system needs a 6 bit-level error detection capability, is set to $B_{req}$ is set to 6 ($B_{req}=6$). Further, $B_{req}$ is not necessarily an integer, and in the disclosure, it will be assumed that $B_{req}$ is set to an integer for convenience of description.

As described above, values which an SCL decoder may configure for achieving the error detection performance required in the communication system are $B_{PC}^{ED}$ and $L_t$.

Accordingly, the SCL decoder proposed in various embodiments of the disclosure determines $B_{PC}^{ED}$ and $L_t$ in a range which satisfies criteria of $0 \leq B_{PC}^{ED} \leq B_{PC}$ and $1 \leq L_t \leq L$ and a criterion expressed as Equation 8.

$$\log_2 L_t - B_{PC}^{ED} \leq -B_{req}+B_{CRC} \quad \text{Equation 8}$$

For example, a pair $(B_{PC}^{ED}, L_t)$ of $B_{PC}^{ED}$ and $L_t$ may be determined as one of various combinations satisfying the criterion expressed as Equation 8.

For example, it will be assumed that a requirement given in the communication system is $-B_{req}+B_{CRC}=0$. In addition, it will be assumed that the communication system has a requirement that $L_t$ needs to be determined as a power of 2 for convenience of implementation.

In addition, if $B_{PC}$ is 3 ($B_{PC}=3$), the pair $(B_{PC}^{ED}, L_t)$ that the SCL decoder may consider may be given as in Table 2 below.

TABLE 2

| $B_{PC}^{ED} \leq B_{PC}$ | $L_t$ |
|---|---|
| 0 | 1 |
| 1 | 2 |
| 2 | 4 |
| 3 | 8 |

Various embodiments of the disclosure propose a scheme in which as many PC bits as possible are used for error detection in a range which satisfies the criterion expressed as Equation 8, and a CRC check operation is performed on as many lists as possible after the SCL decoding operation is completed corresponding to the PC bits used for the error detection. For example, in various embodiments of the disclosure, a maximum value of $B_{PC}^{ED}$ in is used in the range satisfying the criterion expressed in Equation 8, and a maximum value of $L_t$ is used corresponding to the maximum value of $B_{PC}^{ED}$. This will be described below.

First, in a case that the number of lists for which a CRC check operation is performed, that is, a list size $L_t$ is set equal to a total number of lists, i.e., a list size L, if a requirement of error detection performance targeted by a communication system is possible to be satisfied, PC bits do not need to be used for error detection. For example, in this case, $L_t=L$ and $B_{PC}^{ED}=0$.

Alternatively, if $L_t$ is not set smaller than L and the requirement of error detection performance required in the communication system is impossible to be satisfied, a criterion expressed as Equation 8 and a criterion expressed as Equation 9 which is obtained from $0 \leq B_{PC}^{ED} \leq B_{PC}$ are used for using $B_{PC}^{ED}$ of a maximum value in a range which satisfies the requirement of the error detection performance.

$$B_{PC}^{ED} = \min(\max(B_{req}-B_{CRC}, 0), B_{PC}) \quad \text{Equation 9}$$

Equation 9 indicates that a PC bit is used for the error detection at a level at which remaining error detection performance except for error detection performance ($B_{CRC}$) which is achieved by a CRC bit from the requirement of the communication system, i.e., a requirement of an FER ($B_{req}$) is achieved.

When the number of PC bits to be used for the error detection is determined as in Equation 9, the number of lists $L_t$ for which a CRC check operation will be performed is determined as in Equation 10 based on $1 \leq L_t \leq L$ and the criterion expressed in Equation 8.

$$L_t = \max(\min(2^{-E_{req}+(B_{CRC}+B_{PC}ED)}, L), 1) \quad \text{Equation 10}$$

Equation 10 indicates that $L_t$ of a maximum value is used in a range which satisfies the requirement for the error detection of the communication system.

Meanwhile, Equation 9 and Equation 10 are examples of the disclosure, and do not limit a polar decoding operation of the disclosure, and any procedure and any equation capable of obtaining the same result as a result which the disclosure intends to provide as well as Equation 9 and Equation 10 may be used.

Meanwhile, in various embodiments of the disclosure, if error detection performance which a communication system intends to achieve is high, for example, if the error detection performance which the communication system intends to achieve is greater than or equal to threshold error detection performance, relatively many PC bits among all PC bits may be used for error detection. More particularly, none of all PC bits may be used for error correction according to the error detection performance which the communication system intends to achieve.

Alternatively, in various embodiments of the disclosure, if the error detection performance which the communication system intends to achieve is low, for example, if the error detection performance which the communication system intends to achieve is less than the threshold error detection performance, relatively many PC bits among all PC bits may be used for error correction. More particularly, none of all PC bits may be used for the error detection according to the error detection performance which the communication system intends to achieve.

Meanwhile, even in the same communication system, different error detection performance may be required according to a type and a characteristic of transmitted information, so an SCL decoding operation may be performed with different decoding configuration.

For example, in a 3GPP NR communication system, a polar code is used to transmit uplink control information (UCI), and the UCI may include various types of information, such as hybrid automatic retransmission request-acknowledgement (HARQ-ACK), channel state information-part1 (CSI-part1), channel state information-part2 (CSI-part2), and/or the like. Accordingly, the UCI may require relatively high error detection performance or relatively low error detection performance according to a type of information included in the UCI.

For example, the HARQ-ACK includes information requiring retransmission, so if false positive occurs for the HARQ-ACK, retransmission may not be performed even though the retransmission is required, and conversely, retransmission may be performed even though the retransmission is not required. Accordingly, decoding for the HARQ-ACK may require relatively high error detection performance than the CSI-part1 and the CSI-part2.

Like this, required error detection performance may be different for each type of information included in the UCI, so in various embodiments of the disclosure, the number of PC bits to be used for error detection and the number of PC bits to be used for error correction, and the number of lists for which a CRC check will be performed after an SCL decoding operation is completed may be configured differently according to the type of information included in the UCI.

Further, even in the same communication system, different error detection performance may be required according to a characteristic of a service and a communication which are performed, so the SCL decoding operation may be performed with different decoding configuration.

For example, in a 3GPP NR communication system, packets related to services whose purposes are different, such as enhanced mobile broadband (eMBB), ultra-reliable and low latency communications (URLLC), massive machine type communications (mMTC), and/or the like may be transmitted. In this case, different error detection performance may be required according to a characteristic of a service and a communication. Therefore, in various embodiments of the disclosure, the number of PC bits to be used for error detection, the number of PC bits to be used for error correction, and the number of lists for which a CRC check will be performed after an SCL decoding operation is terminated may be configured differently according to the characteristic of the service and the communication.

An example of an operating process of a polar decoder in a communication system according to an embodiment of the disclosure will be described with reference to FIG. 8.

Figure 8:
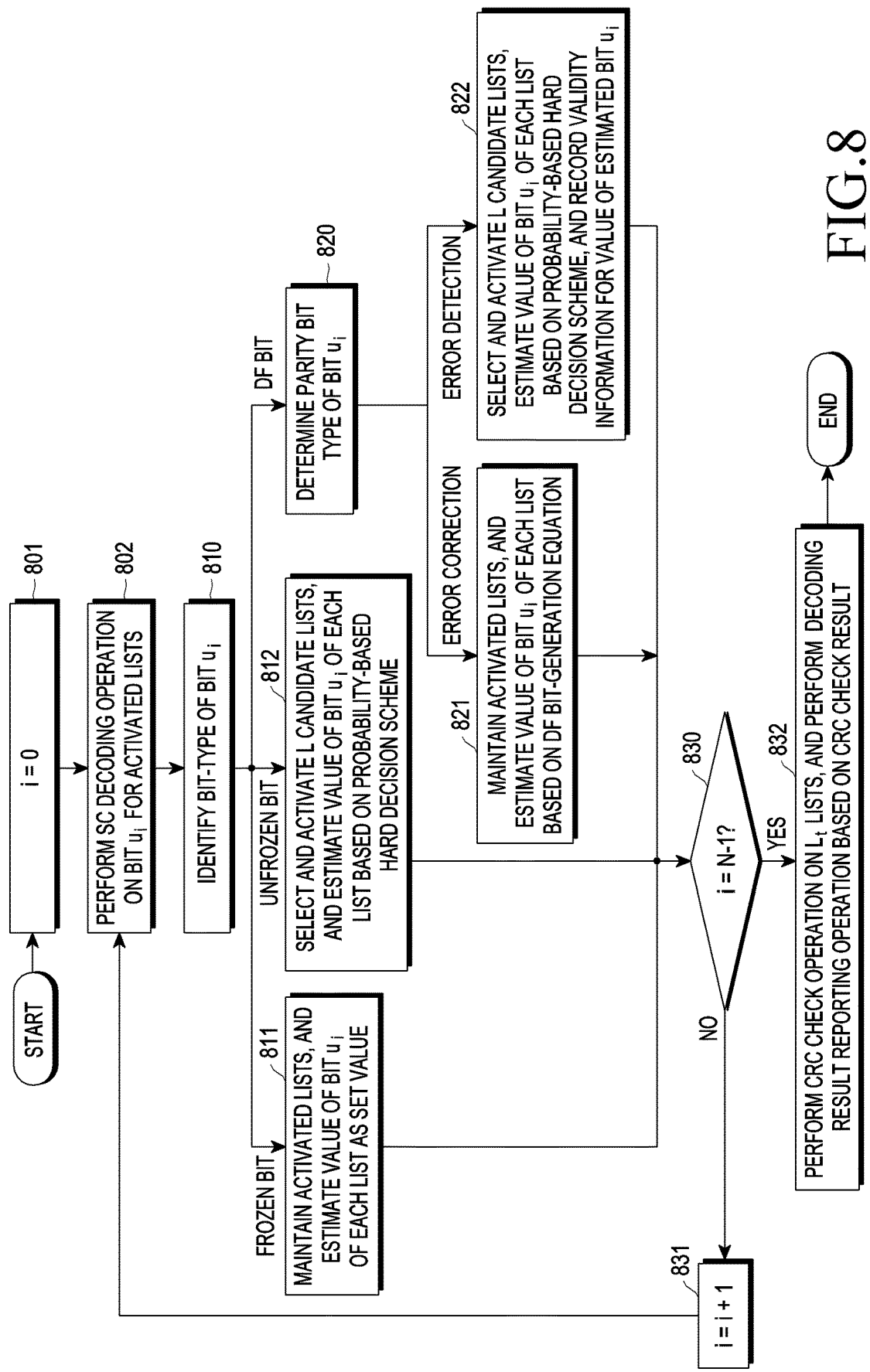
FIG. 8 schematically illustrates an operating process of a polar decoder in a communication system according to an embodiment of the disclosure.

FIG. 8 schematically illustrates an operating process of a polar decoder in a communication system according to an embodiment of the disclosure.

Prior to a description of FIG. 8, it will be assumed that an operation process of a polar decoder proposed in various embodiments of the disclosure is not limited to an operation process illustrated in FIG. 8, and a DF bit is, for example, a PC bit in FIG. 8. Accordingly, it will be noted that the term DF bit and the term PC bit may be interchangeably used in FIG. 8.

Referring to FIG. 8, when a bit sequence to be decoded is inputted, that is, when a bit sequence u is inputted, a polar decoder starts an SCL decoding operation from a bit #0 among bits included in the bit sequence u i.e., a bit with a bit index 0 $u_0$ in ascending order of bit index (i=0) (operation 801). Herein, the SCL decoding operation proceeds according to a bit index i order of the bits included in the bit sequence u, and a bit which is a target for the SCL decoding operation is at a corresponding time point.

The polar decoder performs an SC decoding operation on the bit $u_i$ for lists activated at the corresponding time point (operation 802). For example, the polar decoder calculates a metric (for example, a probability, an LR, an LLR, and the like) indicating a probability that the bit $u_i$ is 0 for the lists activated at the corresponding time point and a PM, and calculates a metric (for example, a probability, an LR, an LLR, and the like) indicating a probability that the bit $u_i$ is 1 for the lists activated at the corresponding time point and a PM. Then, the polar decoder identifies a bit-type of the bit (operation 810). Herein, the polar decoder performs a decoding operation corresponding to the bit type of the bit $u_i$, and this will be described in detail as follows.

Firstly, if the bit $u_i$ is a frozen bit, the polar decoder maintains L lists for bits preceding the bit and estimates a bit value of the bit as a preset value (e.g., 0) (operation 811).

Secondly, if the bit $u_i$ is an information bit or a CRC bit, that is, if the bit $u_i$ is an unfrozen bit, the polar decoder selects L candidate lists from among candidate lists based on a PM (operation 812). Herein, a value of the bit $u_i$ for each of the selected L candidate lists is determined by a calculated probability metric. For example, if the bit $u_i$ is the unfrozen bit, the polar decoder selects and activates the L candidate lists among the 2L candidate lists based on the PM, and estimates a value of the bit $u_i$ for each of the L candidate lists based on a probability-based hard decision scheme.

Thirdly, if the bit $u_i$ is a PC bit, that is, if the bit $u_i$ is a DF bit, the polar decoder determines a type of the DF bit (operation 820). For example, if the bit $u_i$ is the DF bit, the polar decoder determines whether the bit $u_i$ is a PC bit to be used for error detection or a PC bit to be used for error correction. Herein, it will be assumed that the polar decoder determines whether the bit is the PC bit to be used for the error detection or the PC bit to be used for the error correction based on bit indices which correspond to synthetic channels among the bits included in the bit sequence u. For example, PC bits mapped to $B_{PC}^{ED}$ synthetic channels which include a maximum bit index in ascending order of bit index in a set $Q_N^{PC}=\{q_{PC}^1, q_{PC}^2, q_{PC}^3\}$ of bit indices which correspond to synthetic channels to which PC bits having relation of $q_{PC}^1 < q_{PC}^2 < q_{PC}^3$ are mapped. Further, PC bits mapped to remaining $B_{PC}^{EC}$ ($B_{PC}^{EC}=B_{PC}-B_{PC}^{ED}$) synthetic channels are used for error correction. A scheme in which a PC bit is used for error correction and a scheme in which a PC bit is used for error detection in the SCL decoding operation have been specifically described above, a detailed description thereof will be omitted herein.

Meanwhile, if the bit is the PC bit to be used for the error correction, the polar decoder maintains the lists activated at the corresponding time point, and estimates the bit value of the bit u, based on a parity bit-generation equation of a corresponding PC code (operation 821). For example, the polar decoder maintains L lists activated at the corresponding time point and determines the bit value of the bit $u_i$ based on the parity bit-generation equation of the corresponding PC code for each list (operation 821).

Alternatively, if the bit $u_i$ is the PC bit to be used for the error detection, the polar decoder selects and activates L candidate lists from among the candidate lists based on a PM, similarly to an information bit, i.e., an unfrozen bit (operation 822). Herein, a value of the bit for each of the selected L candidate lists is determined by a calculated probability metric. For a specific list, if the value of the bit $u_i$ is different from a value calculated by the parity bit-generation equation of the corresponding PC code, validity information indicating that the parity bit-generation equation of the PC code is not satisfied for the specific list is marked or recorded. Herein, the validity information may be implemented using a memory, a register, a flag, a tag, and/or the like.

Meanwhile, the polar decoder performs a decoding operation as described above on each bit in order of bit indices of the bits included in the bit sequence u. The polar decoder checks whether the SCL decoding operation for all of the bits included in the bit sequence u is completed. For example, the polar decoder checks whether a bit index i of the bit $u_i$ is equal to N−1 (operation 830). Herein, N represents a length of the bit sequence u.

If the bit index i is not equal to N−1, the polar decoder increases the bit index i by a set value, for example, 1 (operation 831), and then repeats an operation of operation 802 to operation 830.

If the bit index i of the bit $u_i$ is equal to N−1, the polar decoder performs a CRC check operation on $L_t$ lists whose probabilities are determined to be high based on a PM among lists maintained after the SCL decoding operation is completed (operation 832). Herein, the polar decoder discards the lists marked as invalid in operation 822, so the lists marked as invalid are not included in the $L_t$ lists. In addition, the number of lists for which a CRC check operation will be performed, i.e., a list size $L_t$ is determined to be less than or equal to the number of lists used in the SCL scheme, i.e., a list size L.

Therefore, if there is a list which passes through the CRC check among top $L_t$ lists whose probabilities are high, the polar decoder computes a corresponding list and reports decoding success. Alternatively, if there is no list which passes through the CRC check among the top $L_t$ lists, the polar decoder reports decoding failure.

Although FIG. 8 illustrates an example of an operating process of a polar decoder in a communication system according to an embodiment of the disclosure, various changes could be made to FIG. 8. For example, although shown as a series of operations, various operations in FIG. 8 could overlap, occur in parallel, occur in a different order, or occur multiple times.

An example of an operating process of a receiving device in a communication system according to an embodiment of the disclosure will be described with reference to FIG. 9A.

Figure 9A:
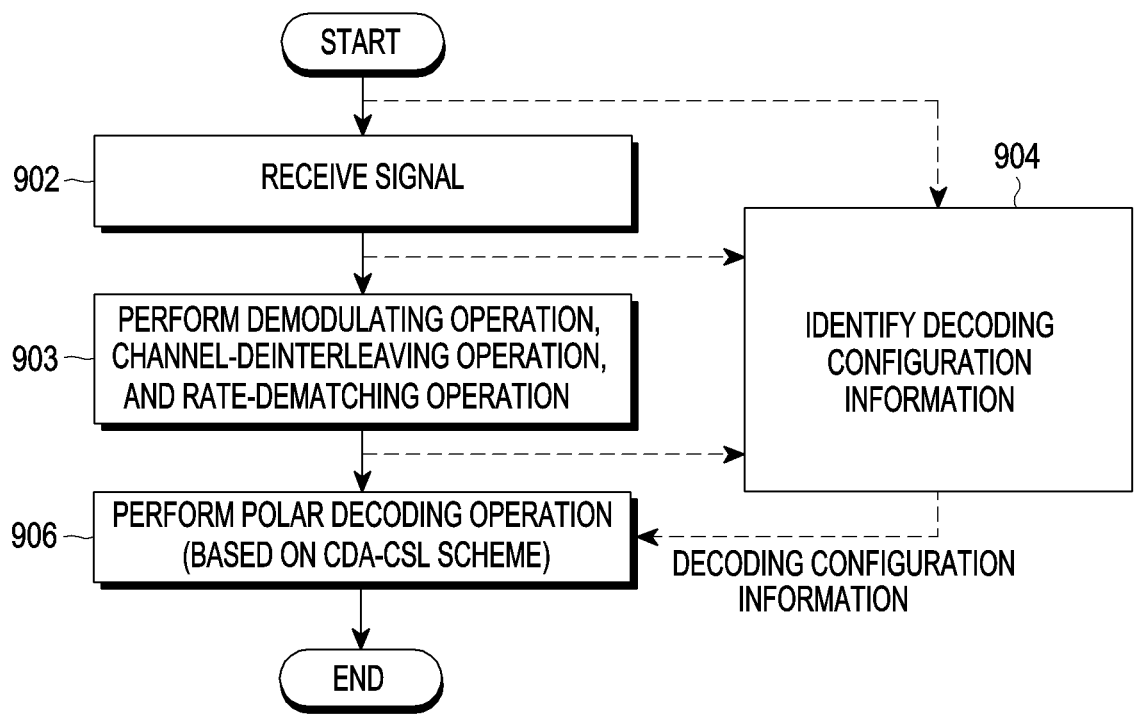
FIG. 9A schematically illustrates an operating process of a receiving device in a communication system according to an embodiment of the disclosure.

FIG. 9A schematically illustrates an operating process of a receiving device in a communication system according to an embodiment of the disclosure.

First, it will be noted that the operating process of the receiving device illustrated in FIG. 9A is an example of an operating process of a receiving device which includes an SCL decoding operation in which PC bits are used for error correction and error detection as described in FIG. 8.

Referring to FIG. 9A, the receiving device receives a signal through a channel (operation 902). The receiving device performs a series of operations, such as a demodulating operation, a channel-deinterleaving operation, a rate-dematching operation, and/or the like on the received signal (operation 903). Herein, the channel-deinterleaving operation and the rate-dematching operation are operations performed if necessary. If a transmitting device performs a channel-interleaving operation and a rate-matching operation, the channel-deinterleaving operation and the rate-dematching operation are performed corresponding to the channel-interleaving operation and the rate-matching operation.

Meanwhile, when an LLR sequence required for a polar decoding operation or a sequence equivalent to the LLR sequence is obtained through the series of operations, the receiving device performs an SCL decoding operation which uses a CRC code and a PC code together, i.e., a CRC and DF-aided SCL (CDA-SCL) operation (operation 906). Herein, the CDA-SCL decoding operation is performed based on configuration information, and this will be described below.

First, the receiving device identifies (904) configuration information required for configuring a CDA-SCL decoding operation of a polar decoder, for example, the number of DF bits, e.g., the number of PC bits, to be used for error correction, the number of PC bits to be used for error detection, location information of the PC bits to be used for the error correction, location information of the PC bits to be used for the error detection, the number of lists for which a CRC check operation will be performed after an SCL decoding operation is terminated, and/or the like.

In various embodiments of the disclosure, the configuration information for the SCL decoding operation may be stored in advance in the receiving device or may be determined whenever the SCL decoding operation is performed. Alternatively, in various embodiments of the disclosure, the configuration information for the SCL decoding operation may be determined whenever an event in which the configuration information for the SCL decoding operation needs to be identified occurs. Alternatively, in various embodiments of the disclosure, when the configuration information for the SCL decoding operation is received from the transmitting device, the configuration information for the SCL decoding operation may be determined as the received configuration information for the SCL decoding operation. For example, in various embodiments of the disclosure, it will be noted that there is no limitation to a time point when the configuration information for the SCL decoding operation is determined or changed.

In various embodiments of the disclosure, a part of information included in the configuration information for the SCL decoding operation may be received from the transmitting device, and another part of the information included in the configuration information for the SCL decoding operation may be determined in the receiving apparatus. For example, the number of PC bits used for error correction and the number of PC bits used for error detection are inputted to the receiving device as configuration information, and as described above, among PC bits which correspond to the number of PC bits used for the error correction and the number of PC bits used for the error detection, a PC bit whose bit index is small may be used for the error correction and a PC bit whose bit index is large may be used for the error detection. Herein, the configuration information is determined by a code parameter, such as a code length, a code rate, and/or the like and an error detection requirement configured by the receiving device, and/or the like, and may be determined at any time before the SCL decoder is operated (904).

In various embodiments of the disclosure, for example, the receiving device may determine the configuration information based on a code parameter, an error detection requirement, and/or the like which are explicitly or implicitly identified before receiving a signal. In various embodiments of the disclosure, as another example, the receiving device may determine the configuration information based on a code parameter, an error detection requirement, and/or the like which are explicitly or implicitly identified after receiving a signal. In various embodiments of the disclosure, as still another example, the receiving device may determine the configuration information based on a code parameter, an error detection requirement, and/or the like which are explicitly or implicitly identified while performing another operation after receiving a signal or after completion of the other operation.

Although FIG. 9A illustrates an example of an operating process of a receiving device in a communication system according to an embodiment of the disclosure, various changes could be made to FIG. 9A. For example, although shown as a series of operations, various operations in FIG. 9A could overlap, occur in parallel, occur in a different order, or occur multiple times.

Another example of an operating process of a receiving device in a communication system according to an embodiment of the disclosure will be described with reference to FIG. 9B.

Figure 9B:
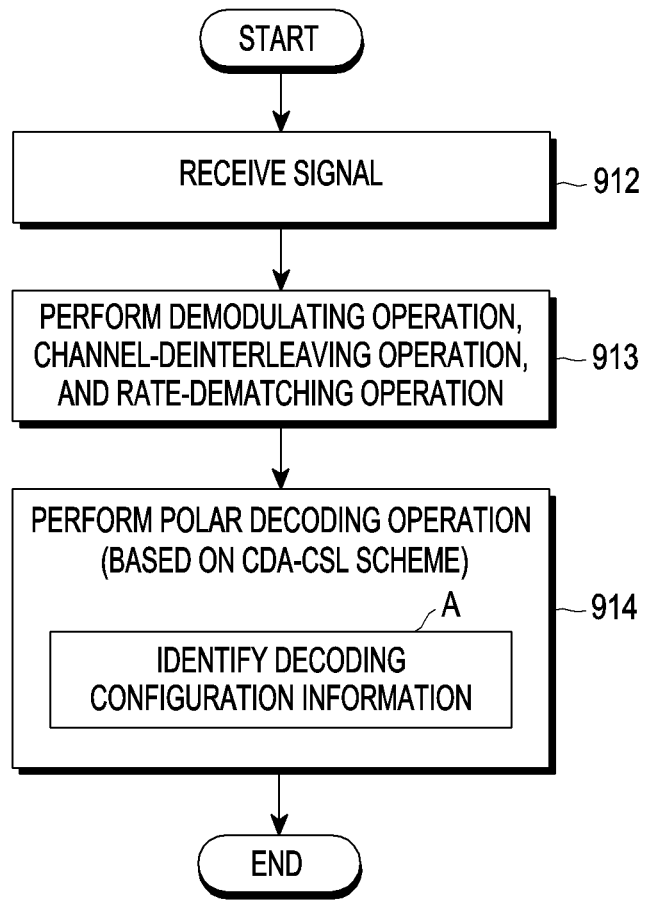
FIG. 9B schematically illustrates an operating process of a receiving device in a communication system according to an embodiment of the disclosure.

FIG. 9B schematically illustrates an operating process of a receiving device in a communication system according to an embodiment of the disclosure.

First, it will be noted that the operating process of the receiving device illustrated in FIG. 9B, like an operating process of a receiving device shown in FIG. 9A, is another example of an operating process of a receiving device which includes an SCL decoding operation in which PC bits are used for error correction and error detection as described in FIG. 8.

Referring to FIG. 9B, the receiving device receives a signal through a channel (operation 912). The receiving device performs various operations, such as demodulation, channel deinterleaving, rate-dematching, and/or the like which are required for a polar decoding operation based on the received signal (operation 913). When an LLR sequence required for the polar decoding operation or a sequence equivalent to the LLR sequence is obtained, the receiving device performs an SCL decoding operation which uses a CRC code and a PC code (operation 914).

An SCL decoder performs a decoding operation based on the number of PC bits to be used for each of error correction and error detection and locations thereof, and the number of lists for which a CRC check operation is performed after an SCL decoding operation is terminated which are determined based on a pre-configured or pre-defined scheme. For example, the SCL decoder may always use two PC bits having a low bit index among three PC bits for error correction and one PC bit having a high bit index for error detection, and may perform a CRC check operation on four lists among all lists after the SCL decoding operation is terminated.

Although FIG. 9B illustrates another example of an operating process of a receiving device in a communication system according to an embodiment of the disclosure, various changes could be made to FIG. 9B. For example, although shown as a series of operations, various operations in FIG. 9B could overlap, occur in parallel, occur in a different order, or occur multiple times.

An example of an SCL decoder in a communication system according to an embodiment of the disclosure will be described with reference to FIG. 10.

Figure 10:
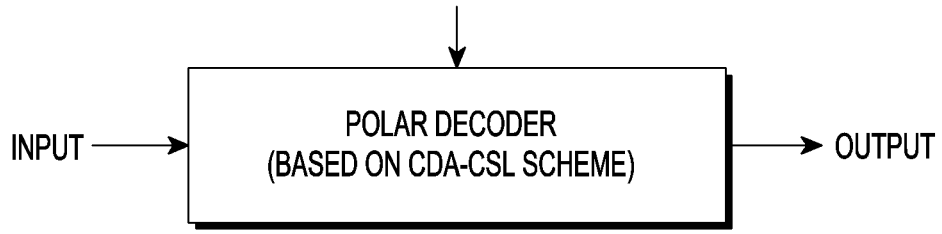
FIG. 10 schematically illustrates an SCL decoder in a communication system according to an embodiment of the disclosure.

FIG. 10 schematically illustrates an SCL decoder in a communication system according to an embodiment of the disclosure.

Referring to FIG. 10, an SCL decoder according to an embodiment of the disclosure performs error correction and error detection operations using a CRC bit and a DF bit. Herein, the DF bit is a bit generated by a PC code, a convolutional code, a BCH code, a distributed CRC code, and/or the like with which the DF bit is used together. When the DF bit is mapped to a bit sequence u which is an input sequence to a polar encoder, the DF bit is generated based on a linear equation of bits having a bit index lower than the DF bit.

In various embodiments of the disclosure, in operating an SCL decoder utilizing such a DF bit and a CRC bit, the number of DF bits to be used for error detection and locations thereof, the number of DF bits to be used for error correction and locations thereof, and the number of lists for which a CRC check operation is performed after a decoding operation is terminated may be adjusted according to a situation or if necessary as described above for achieving trade-off which is targeted between error correction performance and error detection performance. Alternatively, in various embodiments of the disclosure, the parameters may be determined in advance.

Next, how parity bits generated by a CRC code and parity bits generated by a PC code are used in SCL decoding of a polar decoding operation in a communication system according to an embodiment of the disclosure will be described with reference to FIGS. 11A and 11B.

Figure 11A:
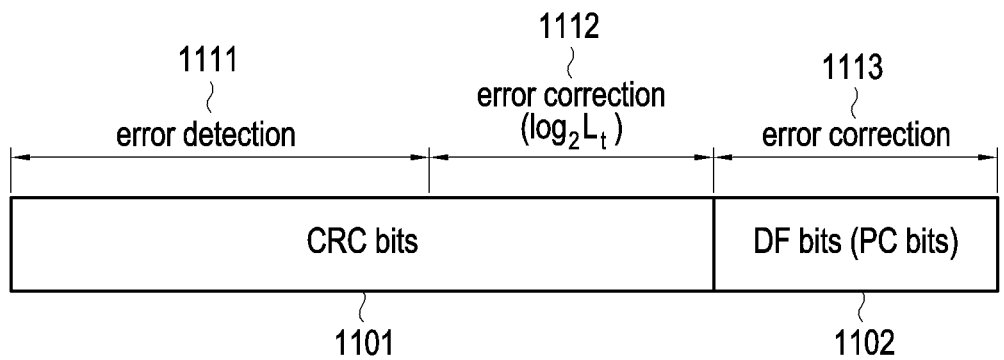
FIG. 11A is a diagram schematically illustrating parity bits being generated by a CRC code and parity bits generated by a parity check (PC) code are used in SCL decoding of a polar decoding operation in a general communication system according to an embodiment of the disclosure.

FIG. 11A is a diagram schematically illustrating an example in which parity bits generated by a CRC code and parity bits generated by a PC code are used in SCL decoding of a polar decoding operation in a general communication system according to an embodiment of the disclosure.

Referring to FIG. 11A, in a general communication system, some of parity bits 1101 generated by a CRC code, i.e., CRC bits 1101 are used to improve error correction performance of SCL decoding, and error correction performance achieved by some of the CRC bits schematically has an effect of $\log_2 L_t$ bits (1112).

In addition, all of parity bits generated by a PC code, i.e., PC bits, i.e., DF bits 1102, are used for error correction (1113), so the total number of bits provided by an outer concatenated code for additional error correction of the SCL decoding is approximately $\log_2 L_t + B_{PC}$. Accordingly, $B_{CRC} + \log_2 L_t$ CRC bits which are remaining CRC bits among total CRC bits are used for error detection (1111).

Figure 11B:
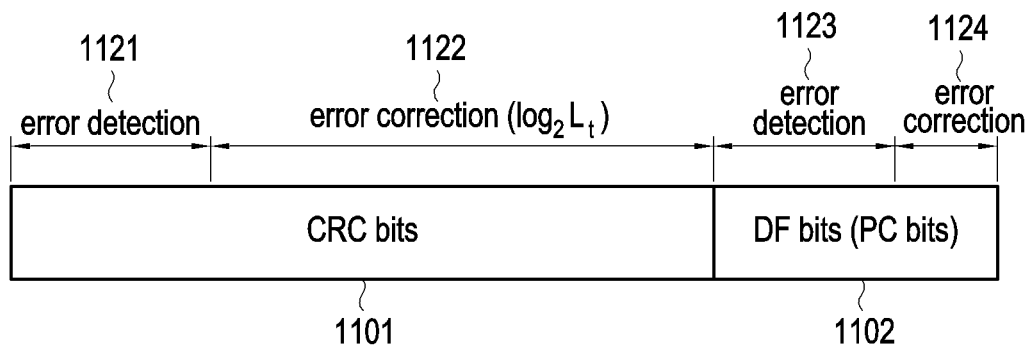
FIG. 11B is a diagram schematically illustrating parity bits being generated by a CRC code and parity bits generated by a PC code are used in SCL decoding of a polar decoding operation in a communication system according to an embodiment of the disclosure.

FIG. 11B is a diagram schematically illustrating an example in which parity bits generated by a CRC code and parity bits generated by a PC code are used in SCL decoding of a polar decoding operation in a communication system according to an embodiment of the disclosure.

Referring to FIG. 11B, in the disclosure, parity bits generated by a PC code, i.e., $B_{PC}^{ED}$ PC bits which are some or all of PC bits are used for error detection (1123). And, remaining $B_{PC}^{EC}$ ($B_{PC}^{EC} = B_{PC} - B_{PC}^{ED}$) PC bits among the PC bits are used for error correction.

As such, in various embodiments of the disclosure, some or all of the PC bits are used for error detection, so the number of CRC bits used for error correction and error detection may be adjusted by increasing the number $L_t$ of lists for which a CRC check operation will be performed. For example, comparing to a general communication system, in various embodiments of the disclosure, when the number $L_t$ of lists for which the CRC check operation will be performed increased, the number of CRC bits (1122) used for error correction is increased, and the number of CRC bits (1121) used for error detection is decreased.

In various embodiments of the disclosure, if it is desired to achieve the same error detection performance as a general communication system, the number $L_t$ of lists for which the CRC check operation will be performed is increased by $2^{\frac{SED}{PC}}$ times compared to the number of lists for which a CRC check operation will be performed and which are used in the general communication system.

An effect according to a polar decoding scheme proposed in the disclosure will be described with reference to FIGS. 12A and 12B, 13A and 13B, 14A and 14B, and 15.

In FIGS. 12A and 12B, 13A and 13B, 14A and 14B, and 15, an effect according to a polar decoding scheme proposed in the disclosure will be described with, for example, a 3GPP NR system in which a CRC code and a PC code are concatenated to a polar code and the polar code to which the CRC code and the PC code are concatenated is used. Unless otherwise noted in FIGS. 12A and 12B, 13A and 13B, 14A and 14B, and 15, it will be assumed that all operations related to polar encoding and polar decoding considered in the disclosure follows a 3GPP NR standard, for example, "3GPP, NR multiplexing and channel coding (Release 15), TSG RAN TS38.212 v15.0.1, February 2017." In FIGS. 12A and 12B, 13A and 13B, 14A and 14B, and 15, a length A of an information bit sequence to be transmitted is greater than or equal to 12 and less than or equal to 19, and a generated information bit sequence is encoded with a 6-bit CRC code. Further, it will be assumed that an obtained CRC codeword bit sequence of a length A+6 is encoded with a polar code with a code rate $R \in \{0.05, 0.1, 0.2, 0.3, 0.4, 0.5, 0.6, 0.8\}$.

In FIGS. 12A and 12B, 13A and 13B, 14A and 14B, and 15, it will be assumed that 3 PC bits, i.e., a 3-bit PC code is generated in a sub-channel allocating process in decoding which is based on the polar code. Further, in FIGS. 12A and 12B, 13A and 13B, 14A and 14B, and 15, it will be assumed that a quadrature phase shift keying (QPSK) scheme is considered as a modulation scheme, and a channel is an additive white Gaussian noise (AWGN) channel. Accordingly, a length of a codeword bit sequence of a polar code is determined as $E=\lceil (A+6)/2R \rceil \times 2$ which is a multiple of a modulation order 2.

In addition, in FIGS. 12A and 12B, 13A and 13B, 14A and 14B, and 15, it will be assumed that a receiving device uses an SCL decoding scheme with a list size L=32. Further, it will be assumed that each of PC bits is used for error correction or error detection in a predetermined manner while the SCL decoding operation is performed, and a CRC code is used for error correction and error detection after decoding is terminated.

Performance according to a location of a parity bit of a PC code used for error detection according to various embodiments of the disclosure will be described with reference to FIGS. 12A and 12B.

Figure 12A:
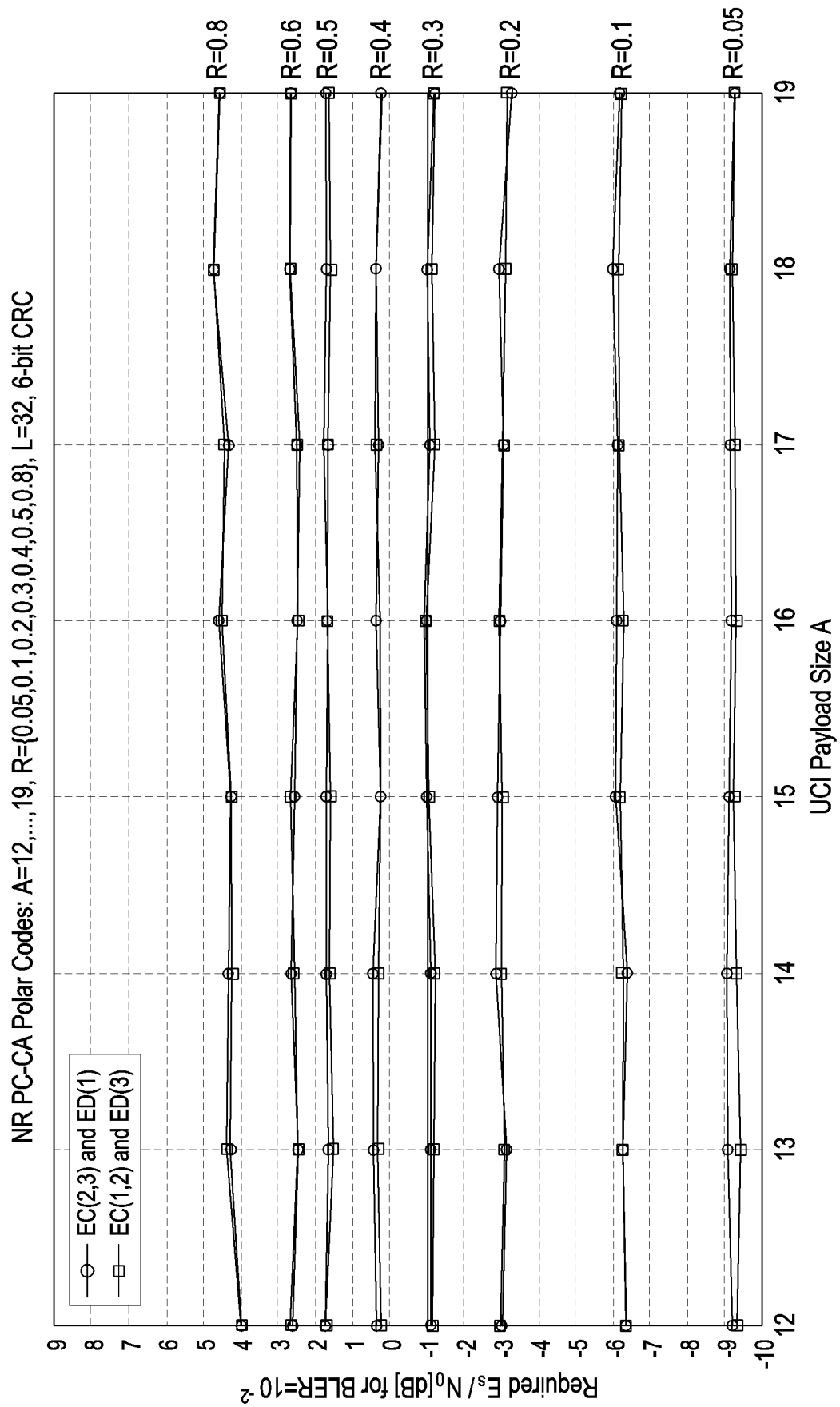
FIG. 12A is a diagram illustrating error correction performance according to a location of a bit of each bit-type in a case that polar codes including 6 CRC bits and 3 dynamic frozen (DF) bits (3 PC bits) are decoded with an SCL decoder with list size 32, 2 DF bits are used for error correction, and 1 DF bit is used for error detection according to an embodiment of the disclosure.

FIG. 12A is a diagram illustrating error correction performance according to a location of a bit of each bit-type in a case that polar codes including 6 CRC bits and 3 DF bits (3 PC bits) are decoded with an SCL decoder with list size 32, 2 DF bits are used for error correction, and 1 DF bit is used for error detection according to an embodiment of the disclosure.

Figure 12B:
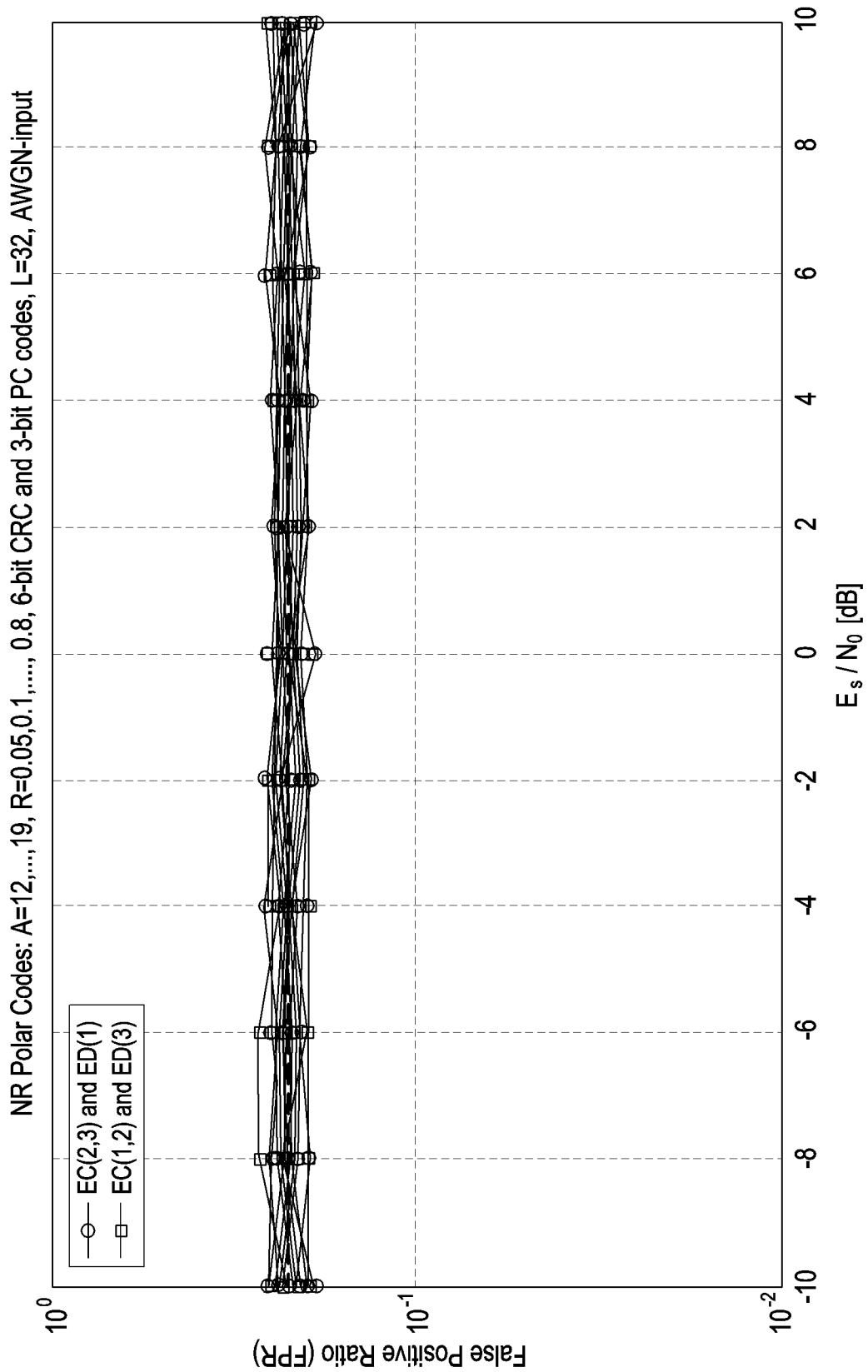
FIG. 12B is a diagram illustrating error correction performance according to a location of a bit of each bit-type in a case that polar codes including 6 CRC bits and 3 DF bits (3 PC bits) are decoded with an SCL decoder with list size 32, 2 DF bits are used for error correction, and 1 DF bit is used for error detection according to an embodiment of the disclosure.

FIG. 12B is a diagram illustrating error correction performance according to a location of a bit of each bit-type in a case that polar codes including 6 CRC bits and 3 DF bits (3 PC bits) are decoded with an SCL decoder with list size 32, 2 DF bits are used for error correction, and 1 DF bit is used for error detection according to an embodiment of the disclosure.

FIGS. 12A and 12B show error correction performance, e.g., a BLER and error detection performance, e.g., an FPR according to a location of a parity bit used for error detection, respectively, in a situation that one of parity bits of a 3-bit PC code, i.e., PC bits is used for the error detection. For example, FIGS. 12A and 12B show performance according to configuration of $Q_N^{PC,EC}$ and $Q_N^{PC,ED}$ in a case of $B_{PC}^{ED}=1$ and $B_{PC}^{EC}=2$. According to an embodiment of the disclosure, bit indices of parity bits of the PC code to be used for error correction and error detection among bit indices of parity bits of the PC code with relation of $q_{PC}^1 < q_{PC}^2 < q_{PC}^3$ are determined as $Q_N^{PC,EC}=\{q_{PC}^1, q_{PC}^2\}$ and $Q_N^{PC,ED}=\{q_{PC}^3\}$.

In addition, a BLER in a case that an encoded signal is transmitted through an AWGN channel and this signal is received and decoded for checking error correction performance is shown in FIGS. 12A and 12B. Further, FIGS. 12A and 12B show energy per modulation symbol to noise spectral density ($E_s/N_0$) which is channel quality at a preset threshold BLER, e.g., 1% by checking a BLER of each polar code with a parameter given for abstracting BLERs for various parameters.

Therefore, in FIGS. 12A and 12B, it will be understood that the lower a location of a graph is, the better error correction performance is. For checking error detection performance, only an AWGN (noise) is inputted to a decoder without a transmission signal, an FPR at which it is erroneously determined that decoding is successful in this situation is identified, and the identified FPR is shown in FIGS. 12A and 12B. Herein, the lower the FPR is, the better the error detection performance is.

In FIGS. 12A and 12B, a relative location of one bit used for error detection is represented by ED('), and relative locations of two bits used for error correction are represented by ED(',''). As may be seen in FIG. 12B, an FPR indicating error detection performance is similar regardless of which parity bit of a PC code is used for error detection.

On the other hand, as may be seen in FIG. 12A, error correction performance varies depending on which parity bit of the PC code is used for error detection. Specifically, if a bit mapped to a high bit index in a bit sequence u among parity bits of the PC code is used for error detection, error correction performance is better compared to a case that the bit mapped to the high bit index in the bit sequence among the parity bits of the PC code is not used for the error detection.

Accordingly, it will be understood that a scheme of selecting parity bits of a PC code proposed in various embodiments of the disclosure achieves better performance compared to a scheme of randomly selecting parity bits of a PC code.

Performance according to a location of a parity bit of a PC code used for error detection according to various embodiments of the disclosure will be described with reference to FIGS. 13A and 13B.

Figure 13A:
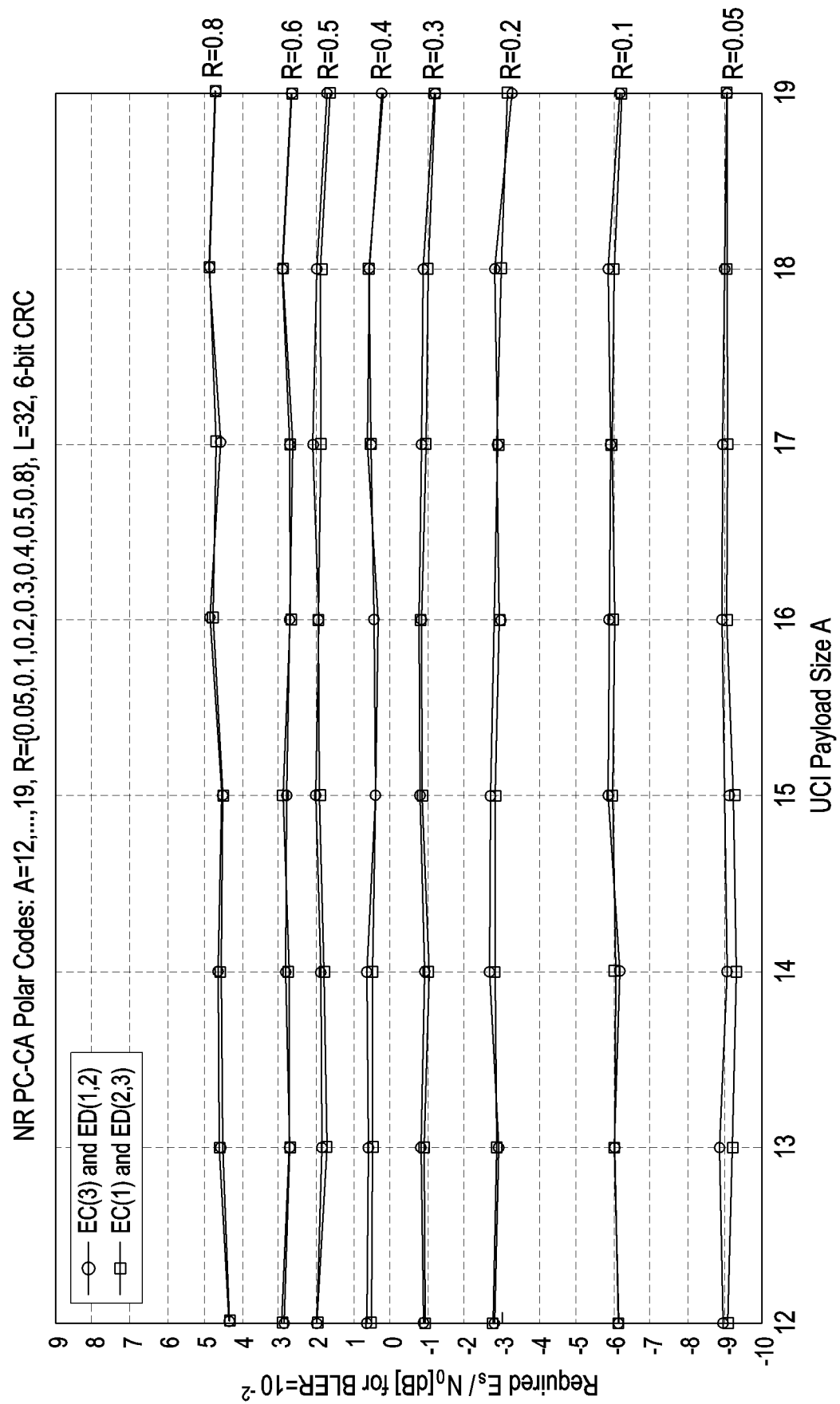
FIG. 13A is a diagram illustrating error correction performance according to a location of a bit of each bit-type in a case that polar codes including 6 CRC bits and 3 DF bits (3 PC bits) are decoded with an SCL decoder with list size 32, 1 DF bit is used for error correction, and 2 DF bits are used for error detection according to an embodiment of the disclosure.

FIG. 13A is a diagram illustrating an error correction performance according to a location of a bit of each bit-type in a case that polar codes including 6 CRC bits and 3 DF bits (3 PC bits) are decoded with an SCL decoder with list size 32, 1 DF bit is used for error correction, and 2 DF bits are used for error detection according to an embodiment of the disclosure.

Figure 13B:
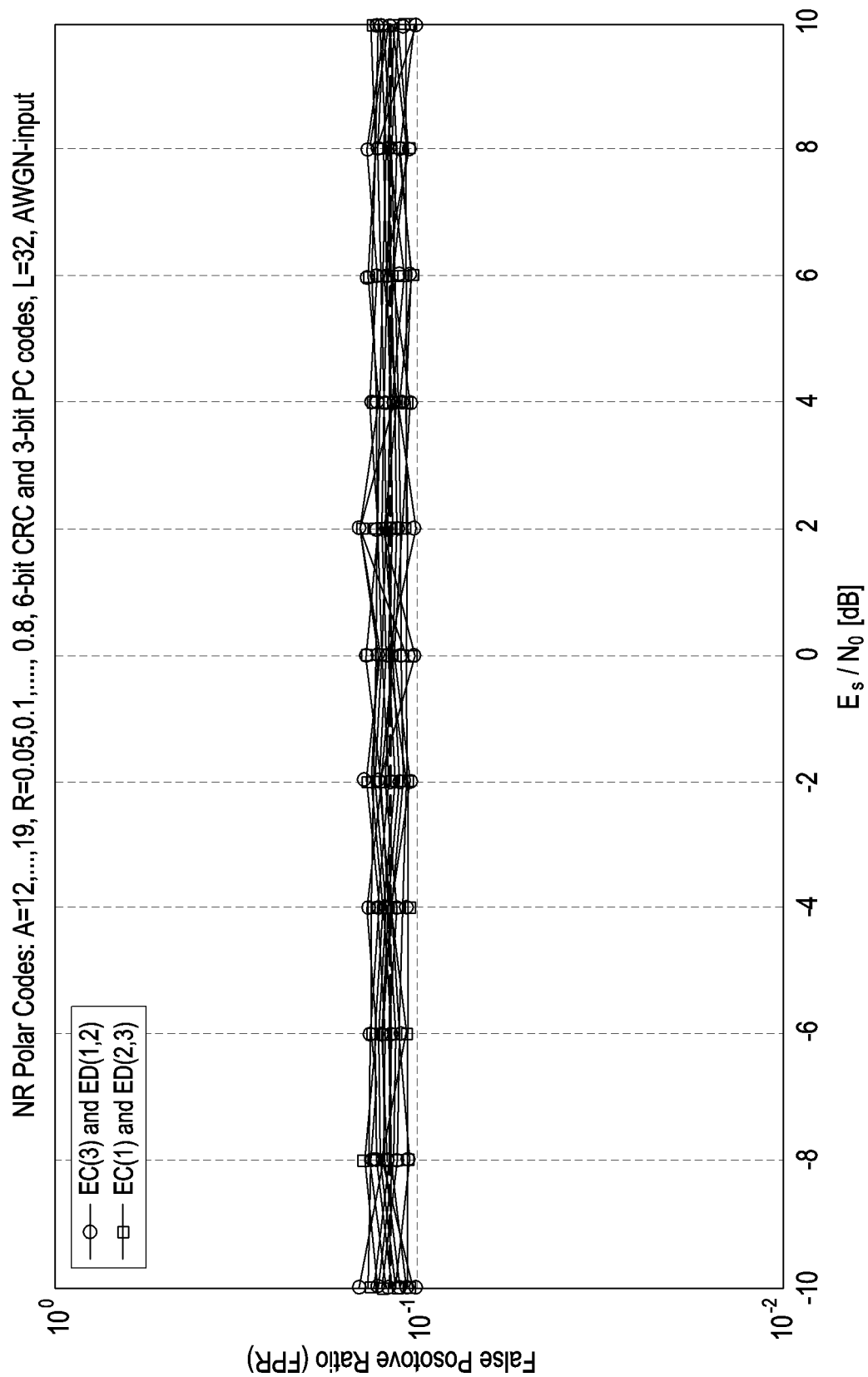
FIG. 13B is a diagram illustrating error correction performance according to a location of a bit of each bit-type in a case that polar codes including 6 CRC bits and 3 DF bits (3 PC bits) are decoded with an SCL decoder with list size 32, 1 DF bit is used for error correction, and 2 DF bits are used for error detection according to an embodiment of the disclosure.

FIG. 13B is a diagram illustrating an error correction performance according to a location of a bit of each bit-type in a case that polar codes including 6 CRC bits and 3 DF bits (3 PC bits) are decoded with an SCL decoder with list size 32, 1 DF bit is used for error correction, and 2 DF bits are used for error detection according to an embodiment of the disclosure.

FIG. 13A illustrates error correction performance, e.g., a BLER according to a location of a parity bit used for error detection in a situation that two parity bits among parity bits of a 3-bit PC code are used for the error detection, and FIG. 13B shows error detection performance, e.g., an FPR according to the location of the parity bit used for the error detection in the situation that the two parity bits among the parity bits of the 3-bit PC code are used for the error detection. For example, FIGS. 13A and 13B show performance according to configuration of $Q_N^{PC,EC}$ and $Q_N^{PC,ED}$ in a case of $B_{PC}^{ED}=2$ and $B_{PC}^{EC}=1$.

According to an embodiment of the disclosure, bit indices of parity bits of the PC code to be used for error correction and error detection among bit indices of parity bits of the PC code with relation of $q_{PC}^1 < q_{PC}^2 < q_{PC}^3$ are determined as $Q_N^{PC,EC} = \{q_{PC}^1\}$ and $Q_N^{PC,ED} = \{q_{PC}^2, q_{PC}^3\}$.

Similar to performance shown in FIGS. 12A and 12B, as may be seen in FIG. 13B, error detection performance, for example, an FPR is similar regardless of which parity bit of a PC code is used for error detection.

On the other hand, as may be seen in FIG. 13A, error correction performance varies depending on which parity bit of the PC code is used for error detection. Specifically, if a bit mapped to a high bit index in a bit sequence u among parity bits of the PC code is used for error detection, error correction performance is better compared to a case that the bit mapped to the high bit index in the bit sequence u among the parity bits of the PC code is not used for the error detection. For example, it will be understood that a scheme of selecting parity bits of a PC code proposed in various embodiments of the disclosure achieves better performance compared to a scheme of randomly selecting parity bits of a PC code.

Performance according to the number of parity bits of a PC code used for error detection and the number of lists for which a CRC check is performed according to various embodiments of the disclosure will be described with reference to FIGS. 14A and 14B.

Figure 14A:
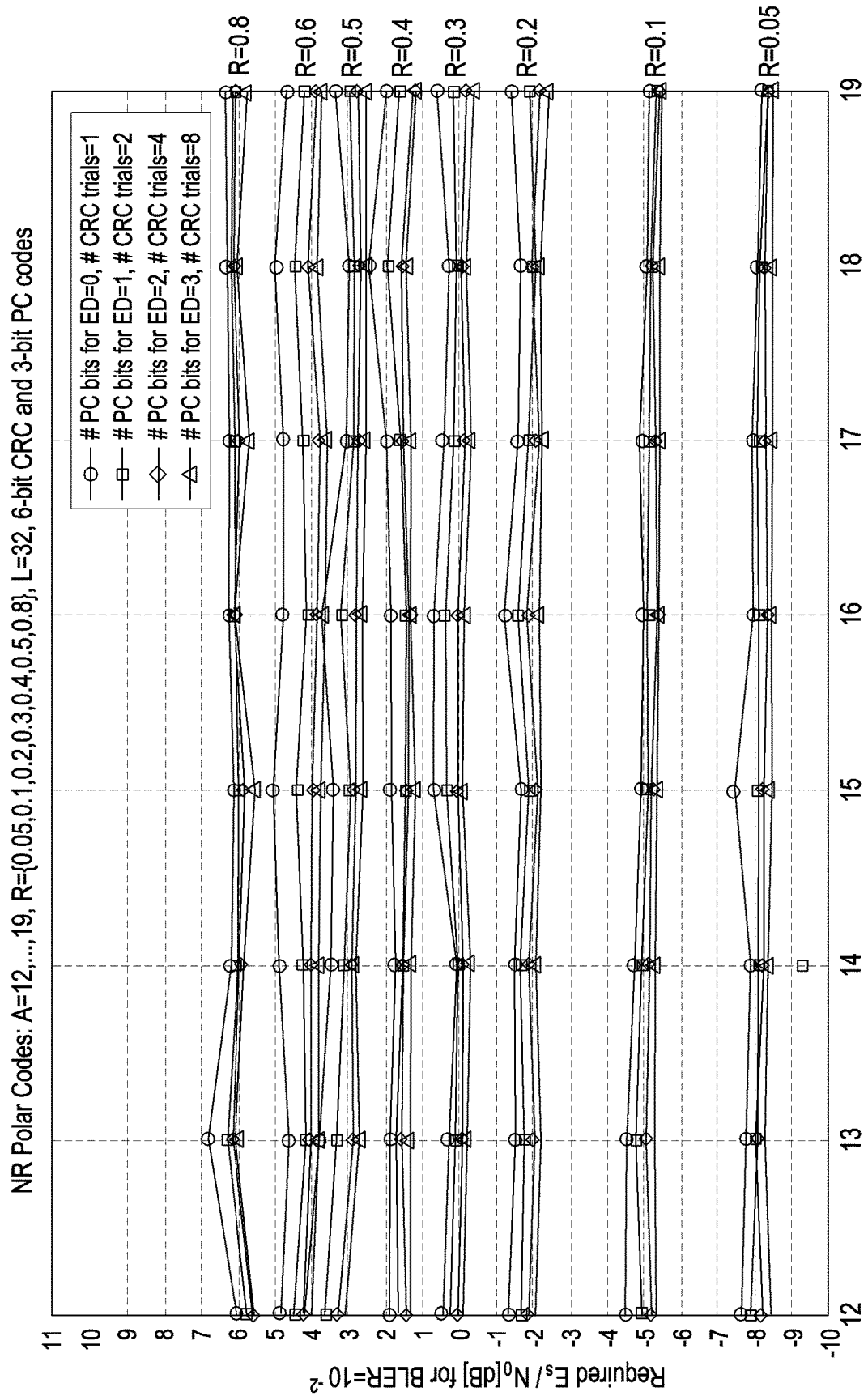
FIG. 14A is a diagram illustrating error correction performance according to a number of DF bits (PC bits) used for error detection and a number of lists for which a CRC check is performed in a case that polar codes including 6 CRC bits and 3 DF bits (3 PC bits) are decoded according to an embodiment of the disclosure.

FIG. 14A is a diagram illustrating an error correction performance according to a number of DF bits (PC bits) used for error detection and a number of lists for which a CRC check is performed in a case that polar codes including 6 CRC bits and 3 DF bits (3 PC bits) are decoded according to an embodiment of the disclosure.

Figure 14B:
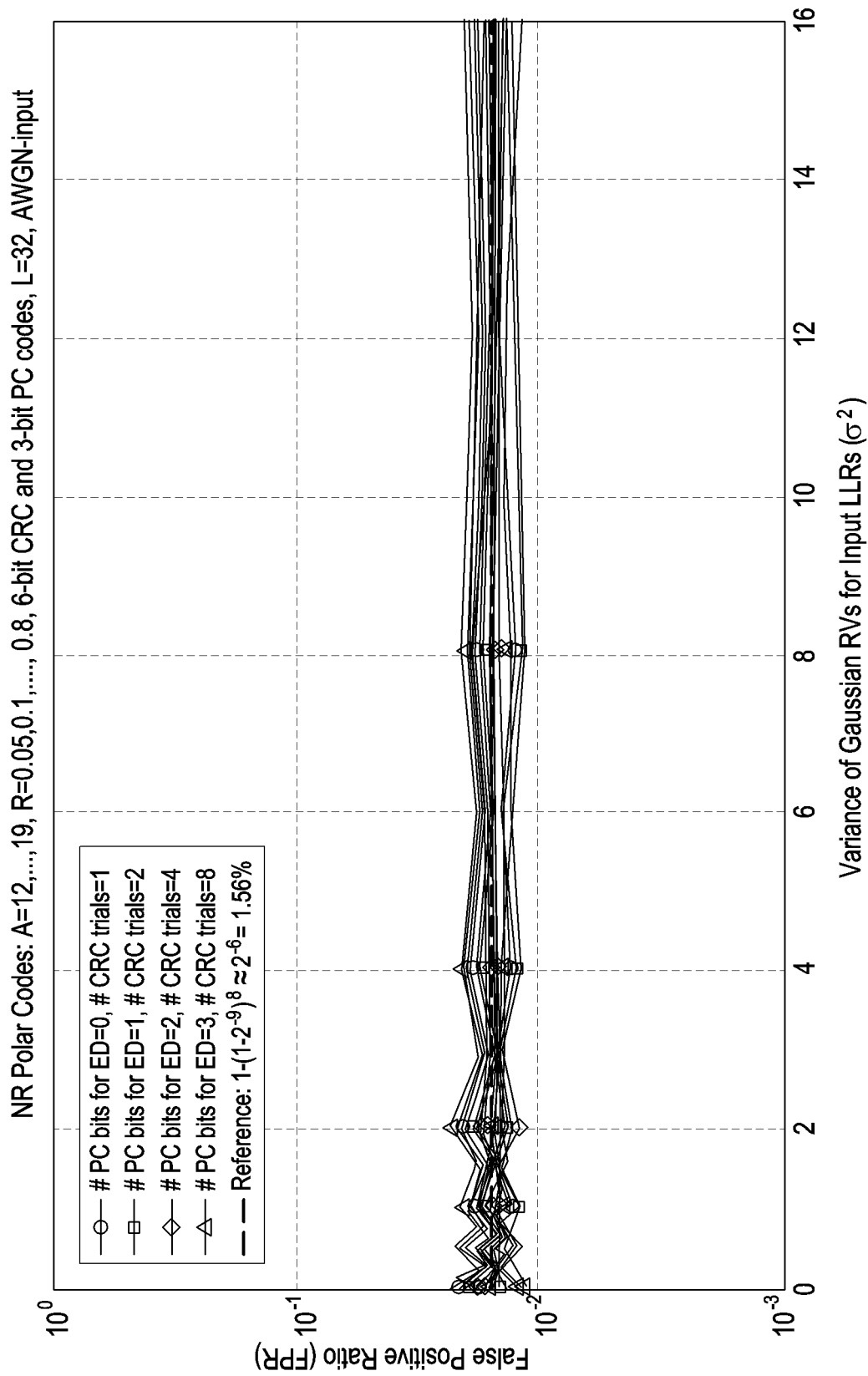
FIG. 14B is a diagram illustrating error correction performance according to a number of DF bits (PC bits) used for error detection and a number of lists for which a CRC check is performed in a case that polar codes including 6 CRC bits and 3 DF bits (3 PC bits) are decoded according to an embodiment of the disclosure.

FIG. 14B is a diagram illustrating an error correction performance according to a number of DF bits (PC bits) used for error detection and a number of lists for which a CRC check is performed in a case that polar codes including 6 CRC bits and 3 DF bits (3 PC bits) are decoded according to an embodiment of the disclosure.

First, for checking an effect of another embodiment of the disclosure, performance according to pair $(B_{PC}^{ED}, L_t)$ configuration which achieves the same error detection level is checked. In this case, it will be assumed that a requirement given by Equation 8 is $-B_{req}+B_{CRC}=0$. For convenience of implementation, it will be assumed that there is a criterion that $L_t$ needs to be determined as a power of 2. In addition, it will be assumed that pairs $(B_{PC}^{ED}, L_t)$ which achieve a requirement given by criteria described above is given as in Table 2.

FIGS. 14A and 14B illustrate error correction performance and error detection performance for given pairs $(B_{PC}^{ED}, L_t)$. The error correction performance may be evaluated by checking a BLER when transmitting and receiving a signal on an AWGN channel. In addition, the error detection performance may be evaluated by checking an FPR which is a probability that a decoder may erroneously determine that decoding is successful when an AWGN is inputted to the decoder.

According to an embodiment of the disclosure, a maximum $B_{PC}^{ED}$ and a maximum according to the maximum $B_{PC}^{ED}$ are used among pairs $(B_{PC}^{ED}, L_t)$ which achieve required error detection. Accordingly, according to an embodiment of the disclosure, in FIG. 2, $B_{PC}^{ED}=3$ and $L_t=8$.

Referring to FIG. 14B, it may be understood that FPRs of all configurations have a similar level regardless of configuration of a pair $(B_{PC}^{ED}, L_t)$.

Referring to FIG. 14A, it may be understood that a case of $B_{PC}^{ED}=3$ and $L_t=8$ according to an embodiment of the disclosure has the best performance. For example, comparing to a case of $B_{PC}^{ED}=0$ and $L_t=1$, it may be understood that difference in channel quality $E_s/N_0$ required to achieve the same BLER 1% is up to 1 dB depending on a parameter.

Therefore, it may be understood that a scheme of configuring a pair $(B_{PC}^{ED}, L_t)$ according to an embodiment of the disclosure described above achieves better performance compared to a scheme of randomly configuring a pair $(B_{PC}^{ED}, L_t)$.

Trade-off between error correction performance and error detection performance according to the number of parity bits of a PC code used for error detection and the number of lists for which a CRC check is performed according to various embodiments of the disclosure will be described with reference to FIG. 15.

Figure 15:
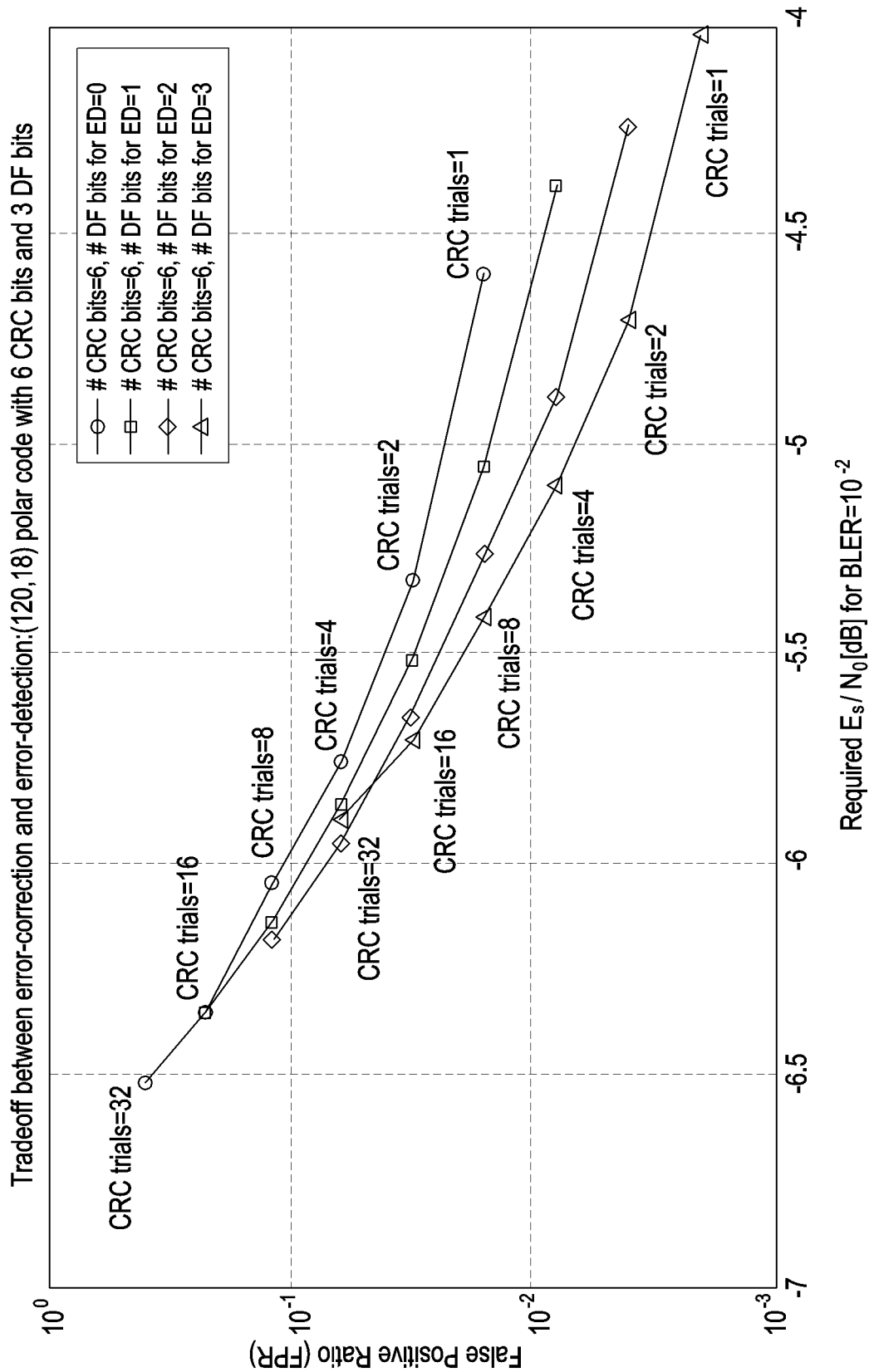
FIG. 15 illustrates trade-off between error correction performance and error detection performance according to the number of DF bits (PC bits) used for error detection and the number of lists for which a CRC check is performed in a case that a (120, 18) polar code including 6 CRC bits and 3 DF bits (PC bits) is decoded according to an embodiment of the disclosure.

FIG. 15 illustrates trade-off between error correction performance and error detection performance according to the number of DF bits (PC bits) used for error detection and the number of lists for which a CRC check is performed in a case that a (120, 18) polar code including 6 CRC bits and 3 DF bits (PC bits) is decoded according to an embodiment of the disclosure.

For more effectively checking an effect of the disclosure, trade-off between an FPR and a BLER according to a configuration of a pair $(B_{PC}^{ED}, L_t)$ in a case that a length of an information bit sequence is 18 (A=18), and a length of a codeword bit sequence is 120 (E=120) is comprehensively checked with reference to FIG. 15. FIG. 15 shows BLER-FPR trade-off for all pairs $(B_{PC}^{ED}, L_t)$ which are possible at the configuration. In FIG. 15, an X-axis represents $E_s/N_0$ for achieving a BLER 0.1%, thereby representing error correction performance, and a Y-axis represents error detection performance by an FPR. As described above, the lower two values are, the better performance is. Accordingly, in FIG. 15, the lower a location of a graph is at a left bottom, the better BLER-FPR trade-off is.

Referring to FIG. 15, if an FPR to be achieved is fixed, excellent BLER-FPR trade-off may be achieved by using a maximum value of $B_{PC}^{ED}$ and a maximum value of $L_t$. For example, if a requirement for an FER is less than 5%, the most performance may be achieved in a case of using the maximum value 3 of $B_{PC}^{ED}$ and the maximum value 16 of $L_t$ in a range satisfying a criterion, corresponding to the maximum value of $B_{PC}^{ED}$.

According to an embodiment of the disclosure, a method to receive a signal generated by a polar code which is designed to include dynamic frozen (DF) bits using outer-concatenated encoding in a communication system is provided, and the method comprises receiving a signal which corresponds to a polar codeword sequence; performing an operation of demodulating, and the like, on the received signal to generate a first signal; and decoding the first signal based on a polar decoding scheme, such as successive cancellation (SC), successive cancellation list (SCL), and the like, to estimate an information sequence, wherein a second number of DF bits among a first number of DF bits included in an encoding process in the polar decoding scheme are used in an error detection operation, and a third number of DF bits among the first number of DF bits are used in an error correction operation.

According to an embodiment of the disclosure, a method to receive a signal generated by a polar code which is designed to include dynamic frozen (DF) bits and CRC bits using outer-concatenated encoding in a communication system is provided, and the method comprises receiving a signal which corresponds to a polar codeword sequence and performing an operation of demodulating, and the like, and decoding the signal which corresponds to the polar codeword sequence based on a polar decoding scheme to estimate an information sequence, wherein the polar decoding scheme is based on a successive cancellation-list (SCL) scheme which uses a first number of lists, a third number of DF bits among a second number of DF bits included in an encoding process in the polar decoding scheme are used in an error detection operation, and a fourth number of DF bits are used in an error correction operation, and an error detection operation is performed on a fifth number of lists among the first number of lists with a CRC bit.

According to an embodiment of the disclosure, a method to receive a signal generated by a polar code which is designed to include dynamic frozen (DF) bits and CRC bits using outer-concatenated encoding in a communication system is provided, and the method comprises receiving a signal which corresponds to a polar codeword sequence and performing an operation of demodulating, and the like, and decoding the signal which corresponds to the polar codeword sequence based on a polar decoding scheme to estimate an information sequence, wherein the polar decoding scheme is based on a successive cancellation-list (SCL) scheme which uses a first number of lists, all of a second number of DF bits included in an encoding process in the polar decoding scheme are used in an error detection operation, and an error detection operation is performed on a third number of lists among the first number of lists.

According to various embodiments of the disclosure, a signal may be transmitted/received based on a polar code in a communication system.

According to various embodiments of the disclosure, a signal may be transmitted/received in consideration of error detection performance and error correction performance in a communication system.

According to various embodiments of the disclosure, at least part of parity bits of an outer code may be used for error detection in a communication system.

According to various embodiments of the disclosure, at least part of parity bits of an outer code may be used for error correction in a communication system.

According to various embodiments of the disclosure, parity bits of an outer code used for error correction and parity bits of the outer code used for error detection may be adaptively adjusted in a communication system.

According to various embodiments of the disclosure, a receiving device may effectively achieve excellent trade-off between an error correction capability and an error detection capability in a process of decoding a codeword including a parity check bit which is encoded with a polar code using a decoding scheme which is based on an SC scheme, such as an SCL decoder, and the like. Particularly, in various embodiments of the disclosure, if different error detection performance is required according to a length, a dimension, and a code rate of a code, an operation of a receiving device may be determined such that the receiving device satisfies a requirement for error detection performance.

In this process, various embodiments of the disclosure achieve more excellent trade-off between an error correction capability and an error detection capability compared to a system which is arbitrarily designed or determined. A polar decoding system proposed in various embodiments of the disclosure may achieve the same error detection capability as an arbitrarily designed (determined) polar decoding system, while achieving better error correction capability than the arbitrarily designed (determined) polar decoding system.

An electronic device according to various embodiments of the disclosure may be one of various types of electronic devices. The electronic devices according to various embodiments of the disclosure may include, for example, a portable communication device (e.g., a smartphone), a computer device, a portable multimedia device, a portable medical device, a camera, a wearable device, or a home appliance. According to various embodiments of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise.

As used in various embodiments of the disclosure, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used in various embodiments of the disclosure, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in various embodiments of the disclosure, the term "module" may include a unit implemented in hardware, software, or firmware, and may interchangeably be used with other terms, for example, "logic," "logic block," "part," or "circuitry", and the like. A module may be a single integral component, or a minimum unit or part thereof, adapted to perform one or more functions. For example, according to an embodiment of the disclosure, the module may be implemented in a form of an application-specific integrated circuit (ASIC).

Various embodiments of the disclosure may be implemented as software (e.g., a program) including one or more instructions that are stored in a storage medium (e.g., an internal memory or external memory) that is readable by a machine (e.g., a master device or a task performing device). For example, a processor of the machine (e.g., the master device or the task performing device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made thereto without departing from the spirit and scope of the disclosure as defined by the appended claims and their equivalents.

What is claimed is:

1. A method of a receiving device in a communication system, the method comprising:
   receiving a signal; and
   decoding the received signal based on a polar decoding scheme which is based on a successive cancellation (SC) scheme to estimate an information sequence,
   wherein, in the polar decoding scheme, a second number of parity bits among a first number of parity bits of an outer code included in an input bit sequence to a polar encoder are used in an error detection operation, and a third number of parity bits among the first number of parity bits are used in an error correction operation.

2. The method of claim 1, wherein the second number of parity bits and the third number of parity bits are determined based on bit indices of bits to which the first number of parity bits are mapped.

3. The method of claim 1, wherein the second number of parity bits and the third number of parity bits are determined:
   based on reliability of sub-channels which correspond to the first number of parity bits, or
   based on a type and a characteristic of information included in the information sequence, or a characteristic of a service and a communication which are applied to information included in the information sequence.

4. The method of claim 1, wherein, in a case that the SC scheme is an SC-list (SCL) scheme using a fourth number of lists, the decoding of the received signal based on the polar decoding scheme comprises:
   determining validity for the fourth number of lists for each of the second number of parity bits after completion of a decoding operation according to the SCL scheme; and
   in a case that there is an invalid list, discarding the invalid list.

5. The method of claim 4, wherein the decoding of the received signal based on the polar decoding scheme further comprises:
   recording information indicating the validity for the fourth number of lists checked for each of the second number of parity bits.

6. A method of a receiving device in a communication system, the method comprising:
   receiving a signal; and
   decoding the received signal based on a polar decoding scheme which is based on a successive cancellation-list (SCL) scheme which uses a first number of lists to estimate an information sequence,
   wherein, in the polar decoding scheme, a third number of parity bits among a second number of parity bits of an outer code included in an input bit sequence to a polar encoder are used in an error detection operation, and the error detection operation is performed for a fourth number of lists among the first number of lists.

7. The method of claim 6, wherein the third number of parity bits are determined based on bit indices of bits to which the second number of parity bits are mapped.

8. The method of claim 6, wherein the third number of parity bits are determined:
   based on reliability of sub-channels which correspond to the second number of parity bits, or
   based on a type and a characteristic of information included in the information sequence, or a characteristic of a service and a communication which are applied to information included in the information sequence.

9. The method of claim 6, wherein the fourth number of lists are determined based on a requirement for a false positive rate (FPR) and a requirement for error detection performance.

10. The method of claim 9, wherein the third number of parity bits are determined based on a number of parity bits of an outer code used for error detection and an FPR.

11. A receiving device in a communication system, the receiving device comprising:
    a receiver configured to receive a signal; and
    a polar decoder configured to decode the received signal based on a polar decoding scheme which is based on a successive cancellation (SC) scheme to estimate an information sequence, wherein, in the polar decoding scheme, a second number of parity bits among a first number of parity bits of an outer code included in an input bit sequence to a polar encoder are used in an error detection operation, and a third number of parity bits among the first number of parity bits are used in an error correction operation.

12. The receiving device of claim 11, wherein the second number of parity bits and the third number of parity bits are determined based on bit indices of bits to which the first number of parity bits are mapped.

13. The receiving device of claim 11, wherein the second number of parity bits and the third number of parity bits are determined:
    based on reliability of sub-channels which correspond to the first number of parity bits, or
    based on a type and a characteristic of information included in the information sequence, or a characteristic of a service and a communication which are applied to information included in the information sequence.

14. The receiving device of claim 11, wherein, in a case that the SC scheme is an SC-list (SCL) scheme using a fourth number of lists, the polar decoder is further configured to:
    determine validity for the fourth number of lists for each of the second number of parity bits after completion of a decoding operation according to the SCL scheme; and
    in a case that there is an invalid list, discard the invalid list.

15. The receiving device of claim 14, wherein the polar decoder is further configured to:
    record information indicating the validity for the fourth number of lists checked for each of the second number of parity bits.

16. A receiving device in a communication system, the receiving device comprising:
    a receiver configured to receive a signal; and
    a polar decoder configured to decode the received signal based on a polar decoding scheme which is based on a successive cancellation-list (SCL) scheme which uses a first number of lists to estimate an information sequence,
    wherein, in the polar decoding scheme, a third number of parity bits among a second number of parity bits of an outer code included in an input bit sequence to a polar encoder are used in an error detection operation, and the error detection operation is performed for a fourth number of lists among the first number of lists.

17. The receiving device of claim 16, wherein the third number of parity bits are determined based on bit indices of bits to which the second number of parity bits are mapped.

18. The receiving device of claim 16, wherein the third number of parity bits are determined:
    based on reliability of sub-channels which correspond to the second number of parity bits, or
    based on a type and a characteristic of information included in the information sequence, or a characteristic of a service and a communication which are applied to information included in the information sequence.

19. The receiving device of claim 16, wherein the fourth number of lists are determined based on a requirement for a false positive rate (FPR) and a requirement for error detection performance.

20. The receiving device of claim 19, wherein the third number of parity bits are determined based on a number of parity bits of an outer code used for error detection and an FPR.

* * * * *